(12) United States Patent
Sakata et al.

(10) Patent No.: US 8,247,812 B2
(45) Date of Patent: Aug. 21, 2012

(54) TRANSISTOR, SEMICONDUCTOR DEVICE INCLUDING THE TRANSISTOR, AND MANUFACTURING METHOD OF THE TRANSISTOR AND THE SEMICONDUCTOR DEVICE

(75) Inventors: Junichiro Sakata, Atsugi (JP); Hiromichi Godo, Isehara (JP); Takashi Shimazu, Machida (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 163 days.

(21) Appl. No.: 12/699,969

(22) Filed: Feb. 4, 2010

(65) Prior Publication Data

US 2010/0207117 A1    Aug. 19, 2010

(30) Foreign Application Priority Data

Feb. 13, 2009   (JP) .................................. 2009-030968

(51) Int. Cl.
*H01L 29/786* (2006.01)
(52) U.S. Cl. ........... 257/43; 257/E21.412; 257/E29.296; 257/E21.46; 257/E33.013; 257/59; 438/104; 438/158
(58) Field of Classification Search .................... 257/43, 257/57, E21.414, E29.068, E29.296, 104
See application file for complete search history.

(56) References Cited

U.S. PATENT DOCUMENTS

| | | | |
|---|---|---|---|
| 4,862,234 A * | 8/1989 | Koden | 257/60 |
| 5,021,850 A * | 6/1991 | Tanaka et al. | 257/59 |
| 5,731,856 A | 3/1998 | Kim et al. | |
| 5,744,864 A | 4/1998 | Cillessen et al. | |
| 5,847,410 A | 12/1998 | Nakajima | |
| 6,294,274 B1 | 9/2001 | Kawazoe et al. | |
| 6,563,174 B2 | 5/2003 | Kawasaki et al. | |
| 6,586,346 B1 | 7/2003 | Yamazaki et al. | |
| 6,727,522 B1 | 4/2004 | Kawasaki et al. | |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |

(Continued)

FOREIGN PATENT DOCUMENTS

EP          1737044 A      12/2006

(Continued)

OTHER PUBLICATIONS

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

(Continued)

*Primary Examiner* — Mamadou Diallo
(74) *Attorney, Agent, or Firm* — Eric J. Robinson; Robinson Intellectual Property Law Office, P.C.

(57) ABSTRACT

An object is to suppress deterioration in electric characteristics in a transistor including an oxide semiconductor layer or a semiconductor device including the transistor. In a transistor in which a channel layer is formed using an oxide semiconductor, a silicon layer is provided in contact with a surface of the oxide semiconductor layer, an impurity semiconductor layer is provided over the silicon layer, and a source electrode layer and a drain electrode layer are provided to be electrically connected to the impurity semiconductor layer.

9 Claims, 20 Drawing Sheets

U.S. PATENT DOCUMENTS

| | | | |
|---|---|---|---|
| 7,297,977 | B2 | 11/2007 | Hoffman et al. |
| 7,301,211 | B2 | 11/2007 | Yamazaki et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,420,209 | B2 * | 9/2008 | Suzawa et al. ............... 257/59 |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,923,311 | B2 * | 4/2011 | Zhang et al. ............... 438/151 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0197350 | A1 | 8/2008 | Park et al. |
| 2008/0203387 | A1 | 8/2008 | Kang et al. |
| 2008/0224133 | A1 * | 9/2008 | Park et al. ............... 257/43 |
| 2008/0224147 | A1 * | 9/2008 | Nagata et al. ............... 257/72 |
| 2008/0254569 | A1 | 10/2008 | Hoffman et al. |
| 2008/0258139 | A1 | 10/2008 | Ito et al. |
| 2008/0258140 | A1 * | 10/2008 | Lee et al. ............... 257/43 |
| 2008/0258141 | A1 * | 10/2008 | Park et al. ............... 257/43 |
| 2008/0258143 | A1 | 10/2008 | Kim et al. |
| 2008/0296568 | A1 * | 12/2008 | Ryu et al. ............... 257/43 |
| 2008/0308796 | A1 | 12/2008 | Akimoto et al. |
| 2008/0308797 | A1 | 12/2008 | Akimoto et al. |
| 2008/0308804 | A1 | 12/2008 | Akimoto et al. |
| 2008/0308805 | A1 | 12/2008 | Akimoto et al. |
| 2008/0308806 | A1 * | 12/2008 | Akimoto et al. ............... 257/59 |
| 2009/0008638 | A1 | 1/2009 | Kang et al. |
| 2009/0008639 | A1 | 1/2009 | Akimoto et al. |
| 2009/0065771 | A1 | 3/2009 | Iwasaki et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0025678 | A1 | 2/2010 | Yamazaki et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0207118 | A1 | 8/2010 | Sakata et al. |
| 2010/0207119 | A1 | 8/2010 | Sakata et al. |
| 2010/0308324 | A1 | 12/2010 | Kim et al. |

FOREIGN PATENT DOCUMENTS

| | | |
|---|---|---|
| EP | 2226847 A | 9/2010 |
| JP | 60-198861 | 10/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2007-096055 | 4/2007 |
| JP | 2007-123861 A | 5/2007 |
| JP | 2007-150158 | 6/2007 |
| JP | 2007-250983 A | 9/2007 |
| WO | WO-2004/114391 | 12/2004 |
| WO | WO-2007/119386 | 10/2007 |
| WO | WO 2008/105250 | 9/2008 |

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA Amoled Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Nakamura. M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6TH International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered AI2O3 Gate Insulator,", Appl. Phys. Lett. (Applied Physics Letters), Sep. 1, 2003, vol. 83, No. 9, pp. 1755-1757.

Nomura et al., "Room-Temperature Fabrication of Transparent Flexible Thin-Film Transistors Using Amorphous Oxide Semiconductors," NATURE, Nov. 25, 2004, vol. 432, pp. 488-492.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350°C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ ($m$ =3, 4, and 5), $InGaO_3(ZnO)_3$, and $Ga_2O_3(ZnO)_m$ ($m$ =7, 8, 9 and 16) in the $In_2O_3$ -$ZnGa_2O_4$-ZnO System," Journal of Solid State Chemistry, Apr. 1, 1995, vol. 116, No. 1, pp. 170-178.

Nakamura et al., "Syntheses and crystal structures of new homologous compounds, indium iron zinc oxides ($InFeO_3(ZnO)_m$) ($m$: natural number) and related compounds," Kotai Butsuri (Solid State Physics), 1993, vol. 28, No. 5, pp. 317-327.

Nomura et al., "Thin-Film Transistor Fabricated in Single-Crystalline Transparent Oxide Semiconductor," SCIENCE, May 23, 2003, vol. 300, No. 5623, pp. 1269-1272.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Osada.T et al., "15.2: Development of Driver-Integrated Panel using Amorphous In-Ga-Oxide TFT,", SID Digest '09 : SID International Symposium Digest of Technical Papers, May 31, 2009, pp. 184-187.

Li.C et al., "Modulated Structures of Homologous Compounds $InMO_3(ZnO)_m$(M=In,Ga; m=Integer) Described by Four-Dimensional Superspace Group,", Journal of Solid State Chemistry, 1998, vol. 139, pp. 347-355.

Lee.J at al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, pp. 899-902.

Kanno.H et al., "White Stacked Electrophosphorecent Organic Light-Emitting Device Employing $MoO_3$ as a Change-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5) Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous IN-GA-ZN-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-277.

Park.S et al., "Challenge to Future Displays: Transparent AM-OLED Driven by PEALD Grown ZnO TFT,", IMID '07 Digest, 2007, p. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 in. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "58.2 Invited Paper : SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Kikuchi.H et al., "Polymer-Stabilized Liquid Crystal Blue Phases,", Nature Materials, Sep. 1, 2002, vol. 1 , pp. 64-68.

Kimizuka.N. et al., "Spinel,$YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] At Temperatures over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

\* cited by examiner

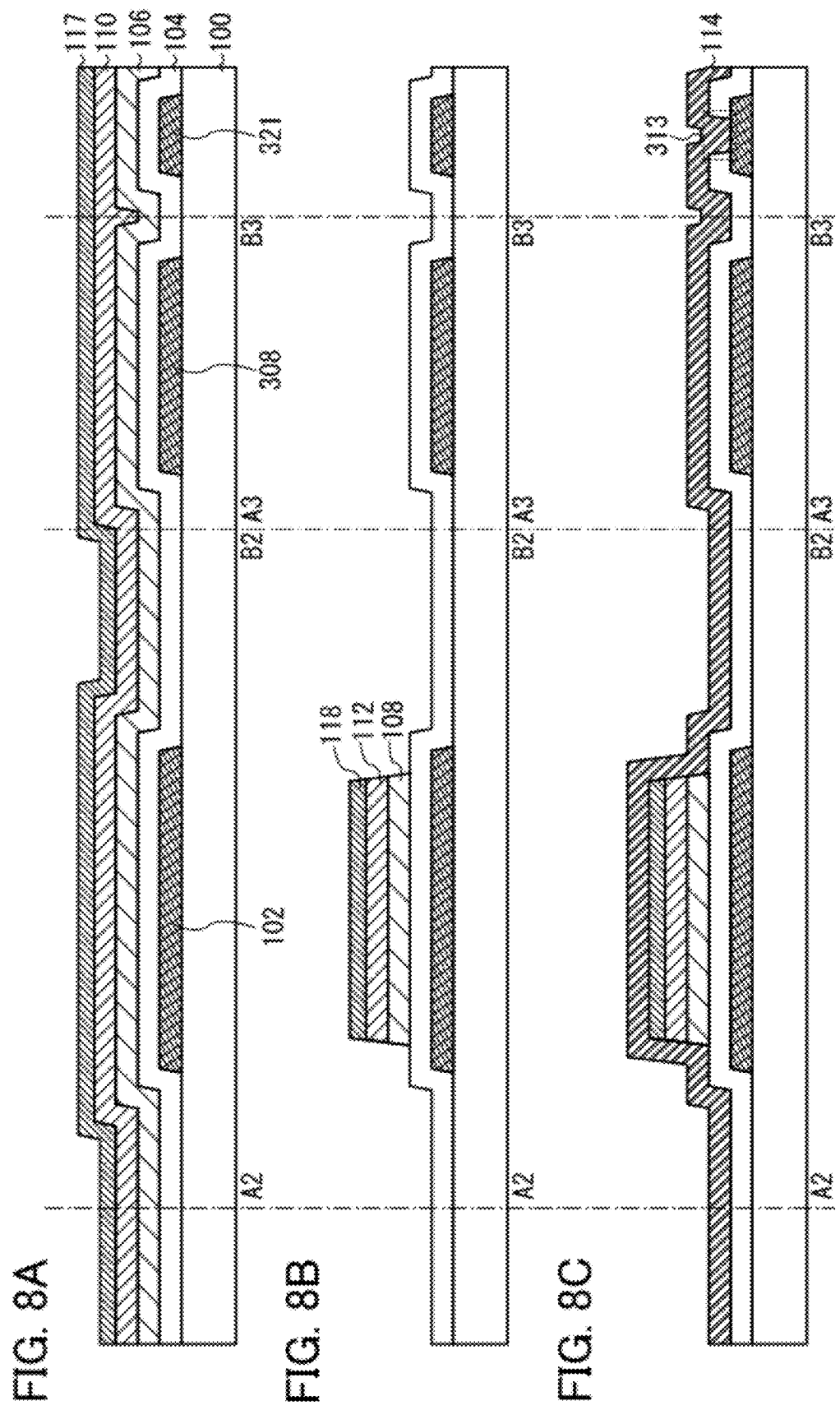

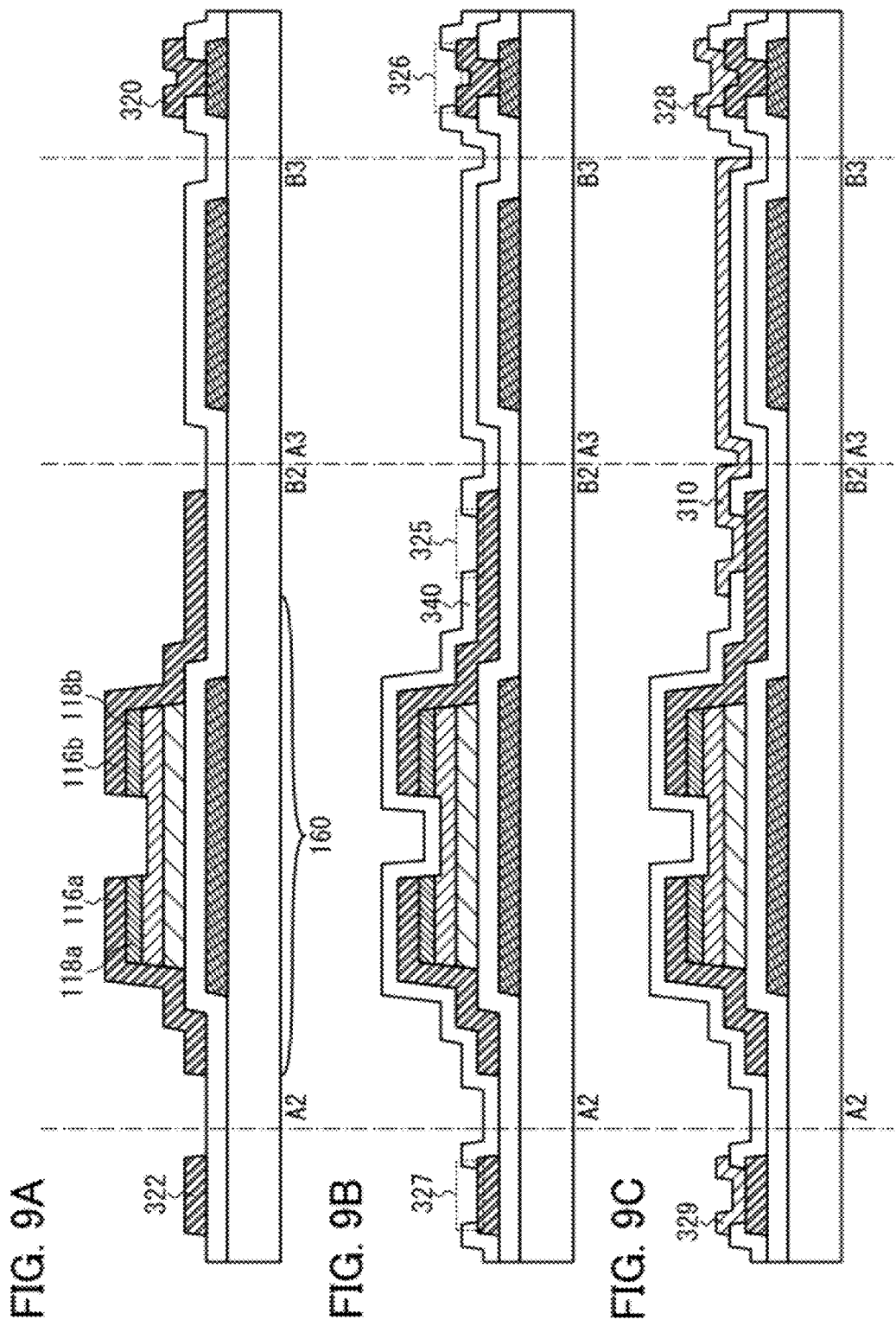

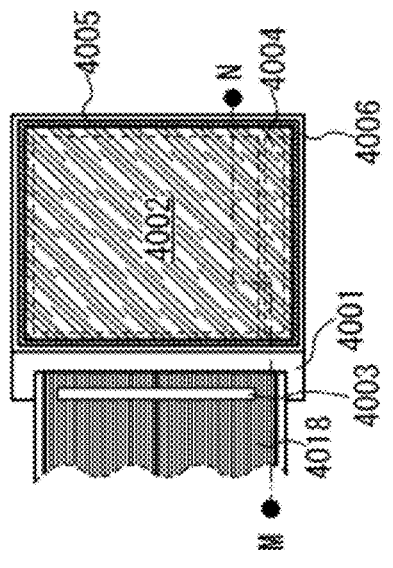
FIG. 14A1
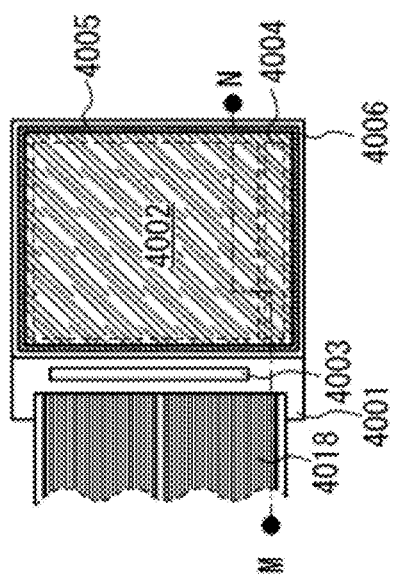
FIG. 14A2
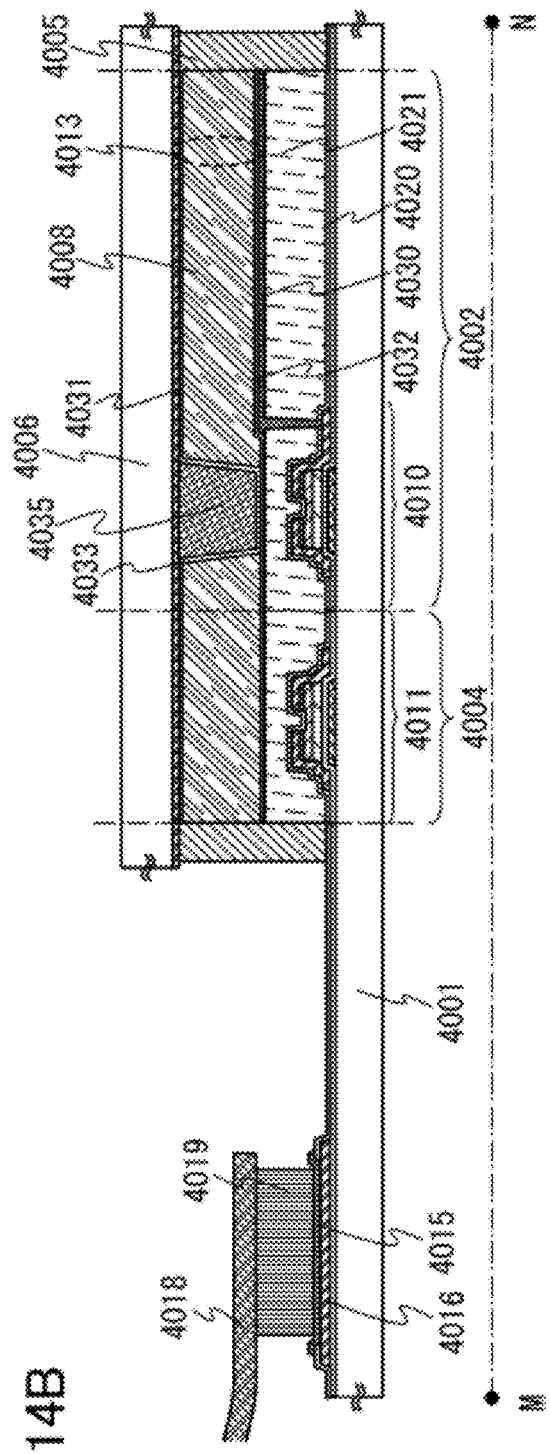
FIG. 14B

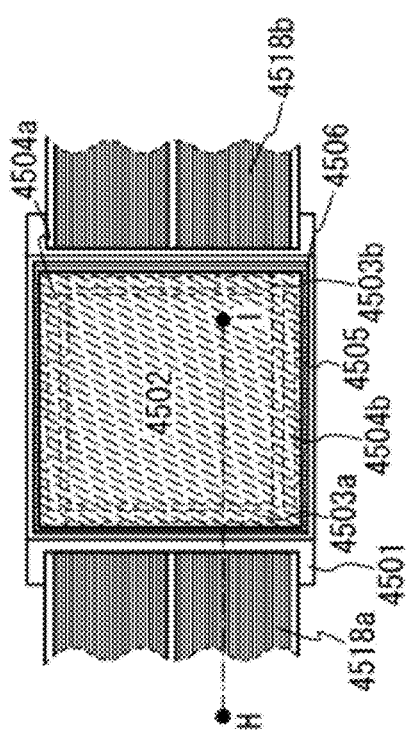
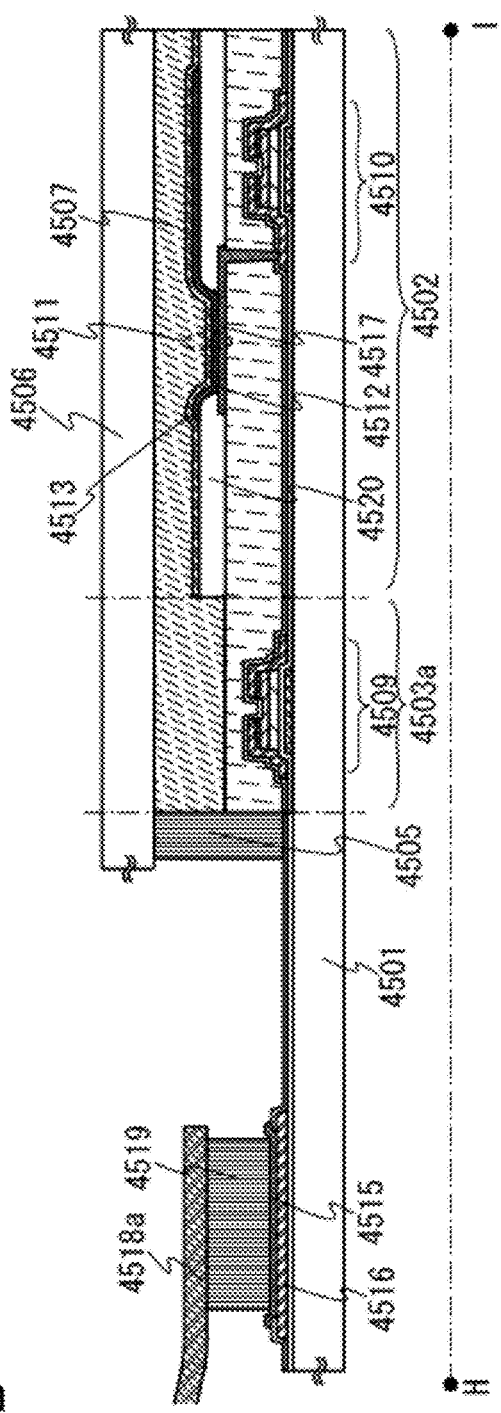
FIG. 15A
FIG. 15B

Diffusion coefficient of H

| Calculation model | D (cm²/sec) |
|---|---|
| a-Si:H | 2.7 × 10⁻⁸ |
| a-SiO₂:H | 7.2 × 10⁻⁷ |

TRANSISTOR, SEMICONDUCTOR DEVICE INCLUDING THE TRANSISTOR, AND MANUFACTURING METHOD OF THE TRANSISTOR AND THE SEMICONDUCTOR DEVICE

BACKGROUND OF THE INVENTION

1. Field of the Invention

The present invention relates to a transistor that uses an oxide semiconductor layer, a semiconductor device including the transistor, and a manufacturing method of the transistor and the semiconductor device.

2. Description of the Related Art

There are various kinds of metal oxides, which are used for a wide range of applications. Indium oxide is a well-known material and used as a material of a transparent electrode which is needed in a liquid crystal display or the like.

Some metal oxides exhibit semiconductor characteristics. In general, metal oxides serve as insulators; however, it is known that metal oxides serve as semiconductors depending on the combination of elements included in the metal oxides.

For example, tungsten oxide, tin oxide, indium oxide, zinc oxide, and the like can be given as metal oxides exhibiting semiconductor characteristics, and thin film transistors in which a channel formation region is formed using such a metal oxide exhibiting semiconductor characteristics are already known (Patent Documents 1 to 4, Non-Patent Document 1).

As the metal oxides, not only single-component oxides but also multi-component oxides are known. For example, $InGaO_3(ZnO)_m$ (m: natural number) having a homologous series is known as a multi-component oxide semiconductor including In, Ga, and Zn (Non-Patent Documents 2 to 4).

Further, it is proved that the oxide semiconductor formed using an In—Ga—Zn based oxide as described above can be used for a channel layer of a thin film transistor (also referred to as a TFT) (Patent Document 5, Non-Patent Documents 5 and 6).

However, semiconductor characteristics are likely to vary because of damage to the oxide semiconductor due to an etchant or plasma or entry of an element such as hydrogen to the oxide semiconductor in an element manufacturing process. Accordingly, problems of variation and deterioration in electrical characteristics of the element are caused.

REFERENCE

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor" *Appl. Phys. Lett.*, 17 Jun. 1996, Vol. 68 p. 3650-3652

[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, p. 298-315

[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, p. 170-178

[Non-Patent Document 4] M. Nakamura, N. Kimizuka, T. Mohri, and M. Isobe, "Syntheses and crystal structures of new homologous compound, indium iron zinc oxides (In-$FeO_3(ZnO)_m$ (m: natural number) and related compounds", *KOTAI BUTSURI (SOLID STATE PHYSICS)*, 1993, Vol. 28, No. 5, p. 317-327

[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, p. 1269-1272

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, p. 488-492

SUMMARY OF THE INVENTION

In view of the above-described problems, it is an object of an embodiment of the present invention to suppress deterioration in electrical characteristics in a transistor including an oxide semiconductor layer or a semiconductor device including the transistor.

In order to achieve the above-described object, an embodiment of the present invention employs a structure such that in a transistor in which a channel layer is formed using an oxide semiconductor, a silicon layer is provided in contact with a surface of the oxide semiconductor layer, an impurity semiconductor layer is provided over the silicon layer, and a source electrode layer and a drain electrode layer are provided to be electrically connected to the impurity semiconductor layer.

An embodiment of the present invention provides a transistor which includes a gate electrode, a gate insulating layer provided over the gate electrode, an oxide semiconductor layer provided over the gate insulating layer and overlapping with the gate electrode, a silicon layer provided in contact with a surface of the oxide semiconductor layer, a first impurity semiconductor layer and a second impurity semiconductor layer provided over the silicon layer, a source electrode layer electrically connected to the first impurity semiconductor layer, and a drain electrode layer electrically connected to the second impurity semiconductor layer.

Another embodiment of the present invention provides a transistor which includes a gate electrode; a gate insulating layer provided over the gate electrode; an oxide semiconductor layer provided over the gate insulating layer and overlapping with the gate electrode; a silicon layer which is provided in contact with a surface of the oxide semiconductor layer and which includes an intrinsic region, a first impurity region, and a second impurity region; a source electrode layer electrically connected to the first impurity region; and a drain electrode layer electrically connected to the second impurity region.

The first impurity region and the second impurity region are provided apart from each other with the intrinsic region interposed therebetween.

Another embodiment of the present invention provides a manufacturing method of a transistor, which includes the steps of forming a gate electrode over a substrate; forming a gate insulating layer over the gate electrode; forming an oxide semiconductor layer over the gate insulating layer; forming a silicon layer over the oxide semiconductor layer; forming an impurity semiconductor layer over the silicon layer; etching the oxide semiconductor layer, the silicon layer, and the impurity semiconductor layer to form an island-shaped oxide semiconductor layer, an island-shaped silicon layer, and an island-shaped impurity semiconductor layer in a region that overlaps with the gate electrode; forming a conductive film so as to cover the island-shaped impurity semiconductor layer; etching the conductive film and the island-shaped impurity semiconductor layer to form a first impurity semiconductor layer, a second impurity semiconductor layer, a source electrode layer electrically connected to the first impurity semiconductor layer, and a drain electrode layer electrically connected to the second impurity semiconductor layer.

Another embodiment of the present invention provides a manufacturing method of a transistor, which includes the steps of forming a gate electrode over a substrate; forming a gate insulating layer over the gate electrode; forming an oxide semiconductor layer over the gate insulating layer; forming a silicon layer over the oxide semiconductor layer; forming a resist mask over the silicon layer; adding an impurity element to the silicon layer using the resist mask to form a first impurity region and a second impurity region in the silicon layer; forming a conductive film over the silicon layer; and etching the conductive film to form a source electrode layer electrically connected to the first impurity region and a drain electrode layer electrically connected to the second impurity region.

In this specification, silicon oxynitride contains more oxygen than nitrogen, and in the case where measurements are conducted using Rutherford backscattering spectrometry (RBS) and hydrogen forward scattering (HFS), silicon oxynitride preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are conducted using RBS and HFS, silicon nitride oxide preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

In this specification, a semiconductor device means any device which can function by utilizing semiconductor characteristics, and a display device, a semiconductor circuit, and an electronic device are all included in the category of the semiconductor device. In addition, in this specification, a display device includes a light-emitting device and a liquid crystal display device in its category. The light-emitting device includes a light-emitting element, and the liquid crystal display device includes a liquid crystal element. A light-emitting element includes, in its category, an element whose luminance is controlled by current or voltage, and specifically includes an inorganic electroluminescent (EL) element, an organic EL element, an LED element, and the like.

When "B is formed on A" or "B is formed over A" is explicitly described in this specification, it does not necessarily mean that B is formed in direct contact with A. The description includes the case where A and B are not in direct contact with each other, i.e., the case where another object is interposed between A and B.

According to an embodiment of the present invention, a silicon layer is provided in contact with a surface of an oxide semiconductor layer in a transistor in which a channel layer is formed using an oxide semiconductor, whereby variation in characteristics of the transistor can be suppressed.

BRIEF DESCRIPTION OF THE DRAWINGS

In the accompanying drawings:

FIGS. 8A to 8C illustrate an example of a manufacturing method of a semiconductor device according to Embodiment 3;

FIGS. 9A to 9C illustrate an example of a manufacturing method of a semiconductor device according to Embodiment 3;

FIGS. 14A1, 14A2, and 14B illustrate examples of a semiconductor device according to Embodiment 4;

FIGS. 15A and 15B illustrate an example of a semiconductor device according to Embodiment 6;

DETAILED DESCRIPTION OF THE INVENTION

Figure 1A:
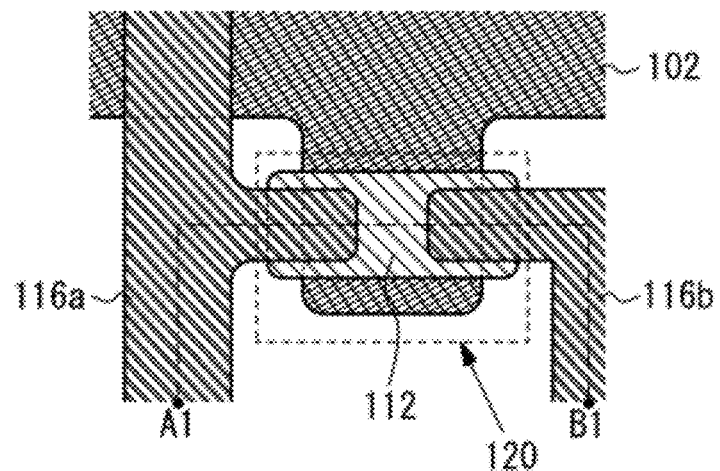
FIGS. 1A and 1B illustrate a structure of a transistor according to Embodiment 1.

Hereinafter, embodiments of the present invention will be described in detail with reference to the accompanying drawings. The present invention is not limited to the following description of the embodiments. It is easily understood by those skilled in the art that modes and details of the present invention can be changed in various ways without departing from the spirit and scope of the present invention. Therefore, the present invention is not construed as being limited to description of the embodiments below. Further, structures according to different embodiments can be implemented in combination as appropriate. In the structures of the invention described below, the same portions or portions having similar functions are denoted by the same reference numerals, and repetitive description thereof is omitted.

Embodiment 1

In this embodiment, an example of a structure of a transistor included in a semiconductor device will be described with reference to the drawings.

A transistor 120 illustrated in FIGS. 1A and 1B includes a gate (including a gate wiring and a gate electrode (hereinafter referred to as a "gate electrode 102")) provided over a substrate 100, a gate insulating layer 104 provided over the gate electrode 102, an oxide semiconductor layer 108 provided over the gate insulating layer 104, a silicon layer 112 provided in contact with a surface of the oxide semiconductor layer 108, a first impurity semiconductor layer 118a and a second impurity semiconductor layer 118b provided over the silicon layer 112, a source (including a source wiring and a source electrode (hereinafter referred to as a "source electrode layer 116a")) electrically connected to the first impurity semiconductor layer 118a, and a drain (including a drain wiring and a drain electrode (also referred to as a "drain electrode layer 116b")) electrically connected to the second impurity semiconductor layer 118b (see FIGS. 1A and 1B).

Figure 1B:
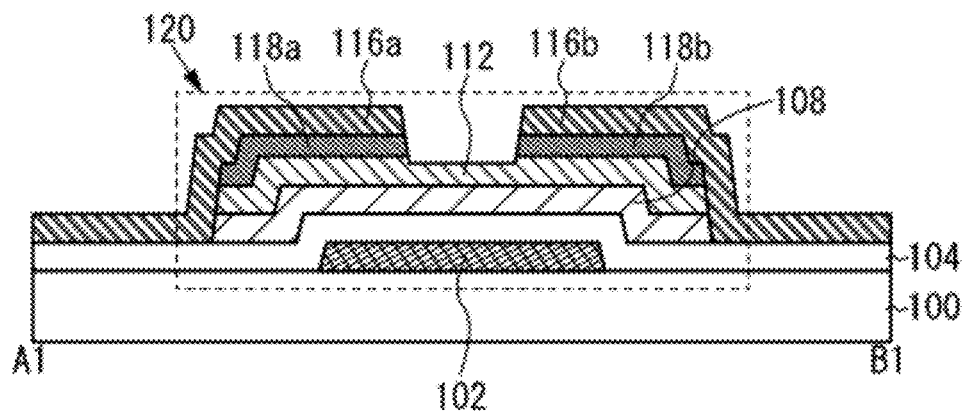

FIG. 1A is a top view, and FIG. 1B is a cross-sectional view taken along line A1-B1 of FIG. 1A.

The oxide semiconductor layer 108 is provided so that at least part thereof overlaps with the gate electrode 102 with the gate insulating layer 104 interposed therebetween, and the oxide semiconductor layer 108 serves as a layer for forming a channel region of the transistor 120 (a channel layer).

An oxide material having semiconductor characteristics may be used for the oxide semiconductor layer 108. For example, an oxide semiconductor having a structure expressed by $InMO_3(ZnO)_m$ (m>0) can be used, and an In—Ga—Zn—O based oxide semiconductor is preferably used. Note that M represents one or more of metal elements selected from gallium (Ga), iron (Fe), nickel (Ni), manganese (Mn), and cobalt (Co). As well as the case where only Ga is contained as m, there is a case where Ga and any of the above metal elements except Ga, for example, Ga and Ni or Ga and Fe are contained as M. Moreover, in the oxide semiconductor, in some cases, a transition metal element such as Fe or Ni or an oxide of the transition metal is contained as an impurity element in addition to the metal element contained as M. In this specification, among the oxide semiconductors whose composition formulae are represented by $InMo_3 (ZnO)_m$ (m>0), an oxide semiconductor whose composition formula includes at least Ga as M is referred to as an In—Ga—Zn—O based oxide semiconductor, and a thin film of the In—Ga—Zn—O based oxide semiconductor is referred to as an In—Ga—Zn—O based non-single-crystal film.

As the oxide semiconductor which is applied to the oxide semiconductor layer 108, any of the following oxide semiconductors can be applied in addition to the above: an In—Sn—Zn—O based oxide semiconductor; an In—Al—Zn—O based oxide semiconductor; a Sn—Ga—Zn—O based oxide semiconductor; an Al—Ga—Zn—O based oxide semiconductor; a Sn—Al—Zn—O based oxide semiconductor; an In—Zn—O based oxide semiconductor; a Sn—Zn—O based oxide semiconductor; an Al—Zn—O based oxide semiconductor; an In—O based oxide semiconductor; a Sn—O based oxide semiconductor; and a Zn—O based oxide semiconductor.

Further, the silicon layer 112 is formed using i-type (intrinsic) silicon. Note that the "i-type silicon" here means silicon which includes a p-type or n-type impurity element at a concentration of $1 \times 10^{17}$ atoms/cm$^3$ or less and oxygen and nitrogen each at a concentration of $1 \times 10^{20}$ atoms/cm$^3$ or less. Therefore, an impurity element such as phosphorus (P) or boron (B) may be included in this silicon within the above-described range. Note that the concentration of impurities included in the silicon layer 112 can be measured by secondary ion mass spectroscopy (SIMS).

As the crystal state of the silicon layer 112, amorphous silicon, microcrystalline silicon, or polycrystalline silicon (polysilicon) can be used. Note that the silicon layer 112 may include two or more crystal structures among the above crystal structures (e.g., the amorphous structure and the microcrystalline structure (or the polycrystalline structure)).

As a formation method of the silicon layer 112, a CVD method, a sputtering method, an evaporation method, a coating method, or the like can be used. The thickness of the silicon layer 112 can be set to be greater than or equal to 1 nm and less than or equal to 500 nm, preferably greater than or equal to 10 nm and less than or equal to 100 nm.

For example, the silicon layer 112 is formed by a sputtering method in an atmosphere which does not include hydrogen or an atmosphere which includes a small amount of hydrogen such as an argon atmosphere, whereby the concentration of hydrogen contained in the silicon layer 112 can be reduced. Accordingly, variation in semiconductor characteristics of the oxide semiconductor layer 108 due to hydrogen contained in the silicon layer 112 can be reduced.

In the case of forming the silicon layer 112 by a sputtering method, a direct current (DC) sputtering apparatus (including a pulsed DC sputtering apparatus which applies a bias in a pulsed manner) is preferably used. The DC sputtering apparatus can deal with a substrate with larger size as compared to an RF sputtering apparatus. This is a great advantage as compared to the case of using an insulating layer such as a silicon oxide layer or a silicon nitride layer as a protective layer, because RF sputtering, which has difficulty in processing a large-sized substrate, needs to be used in the case of forming an insulating layer such as a silicon oxide layer or a silicon nitride layer by a sputtering method (in the case of using an insulator as a target).

In the case of forming the silicon layer 112 with a DC sputtering apparatus, a silicon target or a silicon target into which an impurity such as boron is added can be used.

The first impurity semiconductor layer 118a and the second impurity semiconductor layer 118b have a function of forming ohmic contact between the silicon layer 112 and the source and drain electrode layers 116a and 116b. The first impurity semiconductor layer 118a and the second impurity semiconductor layer 118b can be formed using a film formation gas to which an impurity element imparting one conductivity type is added. In the case of forming an n-channel thin film transistor, typically, phosphorus may be added as the impurity element; for example, a gas including an impurity element imparting n-type conductivity, such as phosphine (chemical formula: $PH_3$), may be added to silicon hydride to form the first impurity semiconductor layer 118a and the second impurity semiconductor layer 118b.

The impurity element imparting one conductivity type (e.g., phosphorus (P)) may be included in the first impurity semiconductor layer 118a and the second impurity semiconductor layer 118b at a concentration of approximately $1 \times 10^{17}$ atoms/cm$^3$ to 1×10$^{22}$ atoms/cm$^3$ inclusive. Note that the concentration of the impurity element in the first impurity semiconductor layer 118a and the second impurity semiconductor layer 118b can be measured by secondary ion mass spectrometry.

There is no particular limitation on the crystallinity of the first impurity semiconductor layer 118a and the second impurity semiconductor layer 118b, and crystalline (microcrystalline or polycrystalline) semiconductor or amorphous semiconductor may be employed. For example, the first impurity semiconductor layer 118a and the second impurity semiconductor layer 118b can be provided using an amorphous silicon layer to which phosphorus is added, a microcrystalline silicon layer to which phosphorus is added, an amorphous silicon germanium layer to which phosphorus is added, a microcrystalline silicon germanium layer to which phosphorus is added, an amorphous germanium layer to which phosphorus is added, a microcrystalline germanium layer to which phosphorus is added, or the like.

As illustrated in FIGS. 1A and 1B, the silicon layer 112 is provided in contact with the back channel side (the surface on the opposite side from the gate electrode 102) of the oxide semiconductor layer 108, whereby the silicon layer 112 serves as a protective film and entry of an element such as hydrogen or the like to the oxide semiconductor layer 108 can be suppressed. As a result, variation in semiconductor characteristics of the oxide semiconductor layer 108 due to entry of an element such as hydrogen can be suppressed; accordingly, variation and deterioration in electrical characteristics of a transistor which uses the oxide semiconductor layer 108 as a channel layer can be suppressed.

Although edge surfaces of the oxide semiconductor layer 108 and the silicon layer 112 are aligned substantially in FIGS. 1A and 1B, the present invention is not limited thereto and the silicon layer 112 may be provided so as to cover an edge portion (an edge surface) of the oxide semiconductor layer 108.

In the case where the source electrode layer 116a and the drain electrode layer 116b are provided over the oxide semiconductor layer 108, the silicon layer 112 serves as a channel protective layer (a channel stop layer). As compared to the case where the silicon layer 112 is not provided in contact with the oxide semiconductor layer 108 (channel-etch type), variation in characteristics caused by exposure of the oxide semiconductor layer 108 can be suppressed.

The silicon layer 112 may be provided in contact with a surface of at least a region in which a channel is formed in the oxide semiconductor layer 108.

Further, in FIGS. 1A and 1B, the source electrode layer 116a serves as a source of the transistor 120, and the drain electrode layer 116b serves as a drain of the transistor 120. Depending on the driving method of the transistor 120, the source electrode layer 116a might serve as a drain and the drain electrode layer 116b might serve as a source.

In the structure illustrated in FIGS. 1A and 1B, germanium, silicon germanium produced by adding germanium in silicon, or silicon carbide (SiC), as well as silicon, may be used as a material provided in contact with the surface of the oxide semiconductor layer 108.

Next, the effectiveness of the oxide semiconductor layer provided in contact with the silicon layer will be described based on simulation with a calculator. Here, the effectiveness of amorphous silicon (a-Si) and amorphous silicon oxide (a-SiO$_2$) for blocking hydrogen was researched.

<Calculation Method>

First, motion of atoms was tracked by numerically solving equations of motion for each atom by classical molecular dynamics simulation where the temperature T was set at 27° C. and the pressure P was set at 1 atm. With the use of mean-square displacement of H atoms obtained from the calculation results, the diffusion coefficient D of H atoms was calculated from Einstein relation (Formula 1). As the diffusion coefficient D is larger, diffusion is more likely to be caused.

[Formula 1]

$$\lim_{t \to \infty} \left\langle \frac{1}{N} \sum_{i=1}^{N} |r_i(t) - r_i(0)|^2 \right\rangle_t = 6Dt \quad (1)$$

$$\begin{pmatrix} \left\langle \frac{1}{N} \sum_{i=1}^{N} |r_i(t) - r_i(0)|^2 \right\rangle_t : \text{mean-square displacement of H} \\ N: \text{number of H atoms} \\ r_i(t): \text{position of } i\text{-th H at time } t \\ \langle \ \rangle_t: \text{time average} \end{pmatrix}$$

<Calculation Model and Calculation Conditions>

Figure 19A:
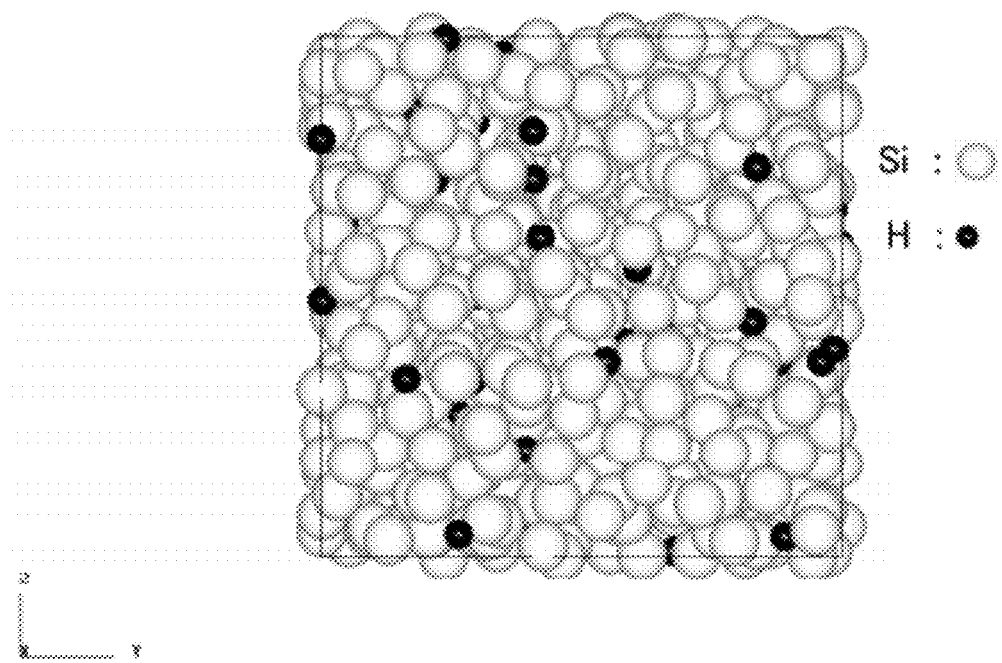
FIGS. 19A and 19B illustrate models which are used in simulation.
Figure 19B:
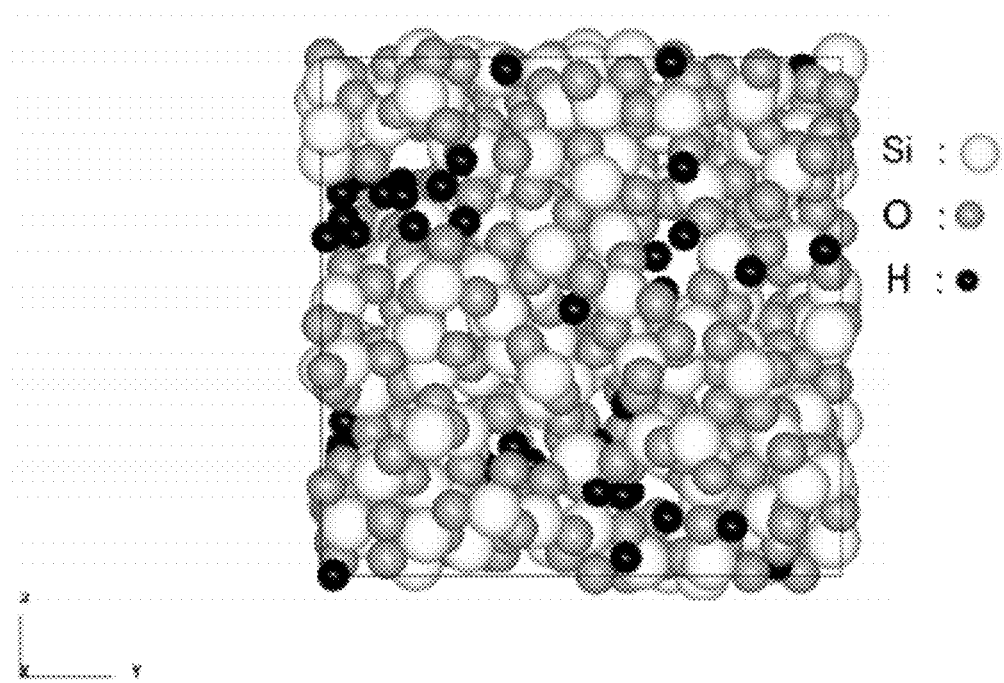

An a-Si:H model in which 60H atoms (10 atom %) are added into 540 a-Si atoms (see FIG. 19A) and an a-SiO$_2$:H model in which 60H atoms (10 atom %) are added into 540 a-SiO$_2$ atoms (see FIG. 19B) were prepared. Here, three-dimensional periodic boundary conditions are used for calculation of a bulk.

An empirical potential which characterizes the interaction between atoms is defined in the classical molecular dynamics method which is used in this calculation, so that force that acts on each atom is evaluated. For the a-Si:H model, a Tersoff potential was used. For a-SiO$_2$ of the a-SiO$_2$:H model, a Born-Mayer-Huggins potential and a Morse potential were used, and for the interaction between a-SiO$_2$ and a hydrogen atom (between a silicon atom and a hydrogen atom and between an oxygen atom and a hydrogen atom), a Lennard-Jones potential was used. As a calculation program, a simulation software "Materials Explorer 5.0", which is manufactured by Fujitsu Limited, was used.

Classical molecular dynamics simulation was performed on each calculation model under the conditions where the temperature T was set at 27° C., the pressure P was set at 1 atm, and the time was set at 1 nsec (time step: 0.2 fsec×5 million steps).

<Calculation Results and Consideration>

Figures 20A, 20B:
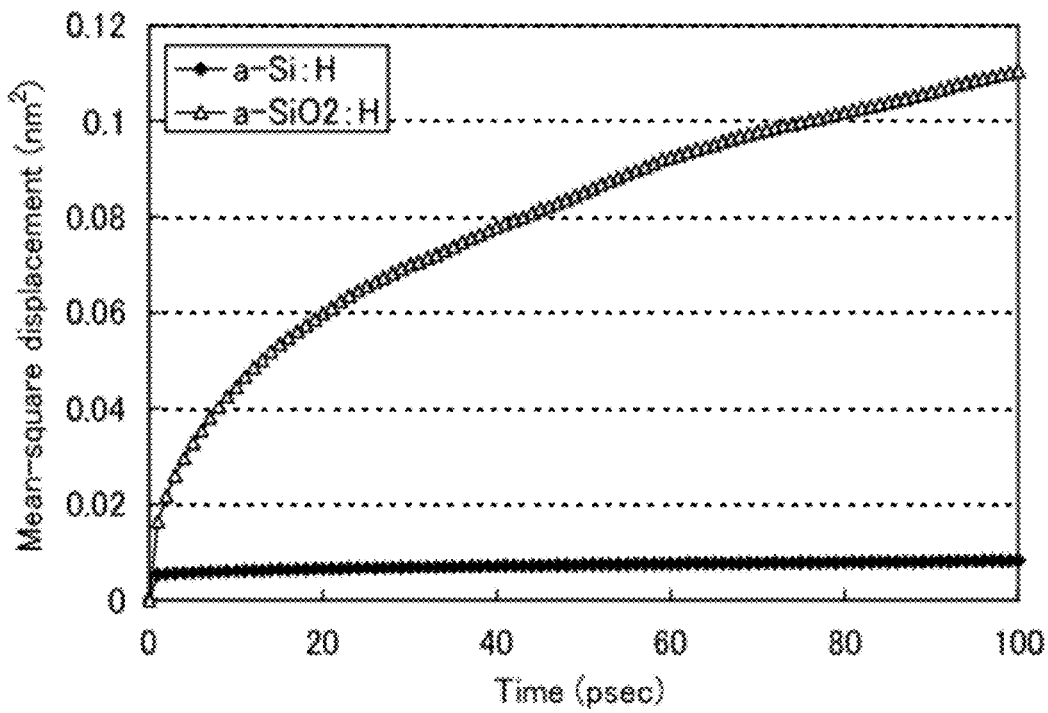
FIGS. 20A and 20B show diffusion coefficients of hydrogen obtained by simulation.

The mean-square displacement of H atoms in a-Si and the mean-square displacement of H atoms in a-SiO$_2$, which were obtained from the calculation, are shown in FIG. 20A. FIG. 20B shows the diffusion coefficients D of H atoms in the calculation models, each of which are obtained from the region where the slope in the graph of FIG. 20A is substantially constant (70 psec to 100 psec). From FIG. 20B, it was found that the diffusion coefficient of H atoms in a-Si is smaller than that of H atoms in a-SiO$_2$ and H atoms in a-Si are less likely to be diffused than H atoms in a-SiO$_2$. In other words, it seems that an a-Si film has a high effect of preventing entry of hydrogen as compared to an a-SiO$_2$ film.

Next, an example of a manufacturing method of the transistor illustrated in FIGS. 1A and 1B will be described with reference to FIGS. 2A to 2D.

Figure 2A:
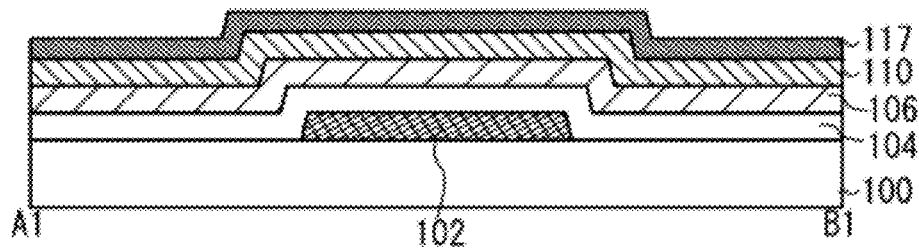
FIGS. 2A to 2D illustrate an example of a manufacturing method of a transistor according to Embodiment 1.

First, the gate electrode 102 is formed over the substrate 100 and the gate insulating layer 104, an oxide semiconductor layer 106, a silicon layer 110, and an impurity semiconductor layer 117 are sequentially formed to be stacked over the gate electrode 102 (see FIG. 2A). It is preferable that layers of from the gate insulating layer 104 to the impurity semiconductor layer 117 be formed in succession.

The substrate 100 may be any substrate as long as it has an insulating surface. A glass substrate can be used, for example. Alternatively, as the substrate 100, an insulating substrate which is formed using an insulator such as a ceramic substrate, a quartz substrate, or a sapphire substrate; a semiconductor substrate which is formed using a semiconductor material such as silicon and whose surface is covered with an insulating material; or a conductive substrate which is formed using a conductor such as metal or stainless steel and whose surface is covered with an insulating material can be used. Further, a plastic substrate can also be used as long as it can withstand heat treatment in the manufacturing process.

The gate electrode 102 can be formed in the following manner: after a conductive film is formed over an entire surface of the substrate 100, the conductive film is etched by a photolithography method.

The gate electrode 102 can be formed using a conductive material such as aluminum (Al), copper (Cu), molybdenum (Mo), tungsten (W), titanium (Ti), or the like. Note that when aluminum is used alone for the wiring or the electrode, there are problems in that aluminum has low heat resistance and that aluminum is easily eroded, for example. Therefore, it is preferable to use aluminum in combination with a heat-resistant conductive material.

As the heat-resistant conductive material, an element selected from titanium (Ti), tantalum (Ta), tungsten (W), molybdenum (Mo), chromium (Cr), neodymium (Nd), and scandium (Sc); an alloy containing the above element as its component; an alloy containing a combination of the above elements; or a nitride containing the above element as its component may be used. A film formed using any of these heat-resistant conductive materials and an aluminum (or copper) film may be stacked, so that the wiring and the electrode may be formed.

The gate electrode 102 may be formed using a material having high conductivity and a light-transmitting property to visible light. As such a material, indium tin oxide (ITO), indium tin oxide containing silicon oxide (ITSO), organoindium, organotin, zinc oxide (ZnO), or the like can be used, for example.

The gate insulating layer 104 can be formed using a silicon oxide film, a silicon oxynitride film, a silicon nitride film, a silicon nitride oxide film, an aluminum oxide film, a tantalum oxide film, or the like. Further, any of these films may be stacked. For example, any of theses films can be formed by a sputtering method or the like with a thickness of greater than or equal to 10 nm and less than or equal to 500 nm.

The oxide semiconductor layer 106 can be formed using an In—Ga—Zn—O based oxide semiconductor. In this case, the oxide semiconductor layer 106 having an amorphous structure can be formed by a sputtering method using an oxide semiconductor target including In, Ga, and Zn (e.g., $In_2O_3$:$Ga_2O_3$:$ZnO$=1:1:1).

For example, the conditions of the sputtering method can be set as follows: the distance between the substrate 100 and the target is 30 mm to 500 mm inclusive, the pressure is 0.01 Pa to 2.0 Pa inclusive, the direct current (DC) power supply is 0.25 kW to 5.0 kW inclusive, the temperature is 20° C. to 200° C. inclusive, the atmosphere is an argon atmosphere, an oxygen atmosphere, or a mixed atmosphere of argon and oxygen.

Note that a pulse direct current (DC) power supply is preferable in a sputtering method because dust can be reduced and the film thickness can be uniform. The thickness of the oxide semiconductor layer 106 can be set to greater than or equal to 5 nm and less than or equal to 200 nm.

In the case where an In—Ga—Zn—O based non-single-crystal film is formed as the oxide semiconductor layer 106, an insulating impurity may be contained in the oxide semiconductor target including In, Ga, and Zn. The impurity is an insulating oxide typified by silicon oxide, germanium oxide, aluminum oxide, or the like; an insulating nitride typified by silicon nitride, aluminum nitride, or the like; or an insulating oxynitride such as silicon oxynitride or aluminum oxynitride. Any of these insulating oxides and insulating nitrides is added at a concentration at which electrical conductivity of the oxide semiconductor does not deteriorate.

When the oxide semiconductor layer 106 contains an insulating impurity, crystallization of the oxide semiconductor layer 106 can be suppressed, which enables stabilization of characteristics of the thin film transistor. Further, in the case where an impurity such as silicon oxide is contained in the In—Ga—Zn—O based oxide semiconductor, crystallization of the oxide semiconductor or generation of microcrystal grains can be prevented even through heat treatment at 200° C. to 600° C. inclusive.

As the oxide semiconductor which is applied to the oxide semiconductor layer 106, any of the following oxide semiconductors can be applied in addition to the above: an In—Sn—Zn—O based oxide semiconductor, an In—Al—Zn—O based oxide semiconductor, an Sn—Ga—Zn—O based oxide semiconductor, an Al—Ga—Zn—O based oxide semiconductor, an Sn—Al—Zn—O based oxide semiconductor, an In—Zn—O based oxide semiconductor, an Sn—Zn—O based oxide semiconductor, an Al—Zn—O based oxide semiconductor, an In—O based oxide semiconductor, an Sn—O based oxide semiconductor, and a Zn—O based oxide semiconductor. Further, by addition of an impurity which suppresses crystallization to keep an amorphous state to these oxide semiconductors, characteristics of the thin film transistor can be stabilized. As the impurity, an insulating oxide typified by silicon oxide, germanium oxide, aluminum oxide, or the like; an insulating nitride typified by silicon nitride, aluminum nitride, or the like; or an insulating oxynitride such as silicon oxynitride or aluminum oxynitride is applied.

The silicon layer 110 can be formed by a sputtering method. In this case, the silicon layer 110 can be formed by a DC sputtering method using a silicon target or a silicon target to which boron is added, in an argon atmosphere. However, without limitation to this, the silicon layer 110 may be formed by a CVD method or the like. Depending on the film formation conditions, there is a case where a mixed layer of the oxide semiconductor layer 108 and the silicon layer 110 (e.g., an oxide of silicon or the like) is formed thin at an interface between the oxide semiconductor layer 108 and the silicon layer 110.

The impurity semiconductor layer 117 can be formed, for example, by glow discharge plasma using a deposition gas containing silicon or germanium, hydrogen, and phosphine (diluted with hydrogen or silane) which are mixed in a treatment chamber of a plasma CVD apparatus. For example, the deposition gas containing silicon or germanium is diluted with hydrogen, and amorphous silicon to which phosphorus is added, microcrystalline silicon to which phosphorus is added, amorphous silicon germanium to which phosphorus is added, microcrystalline silicon germanium to which phosphorus is added, amorphous germanium to which phosphorus is added, microcrystalline germanium to which phosphorus is added, or the like is deposited as the impurity semiconductor layer 117.

Figure 2B:
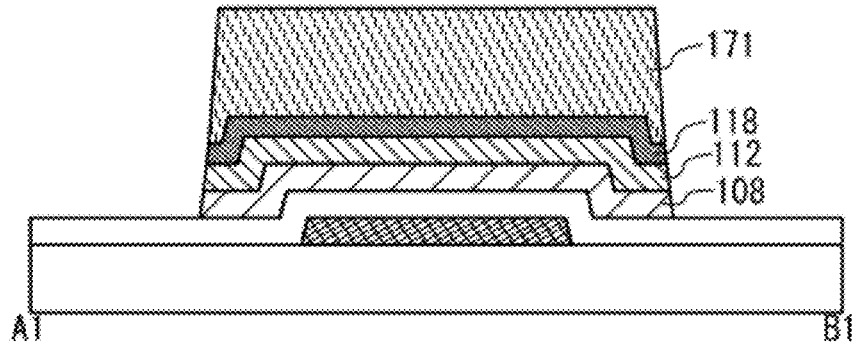

Next, the oxide semiconductor layer 106, the silicon layer 110, and the impurity semiconductor layer 117 are etched to form the island-shaped oxide semiconductor layer 108, the island-shaped silicon layer 112, and the island-shaped impurity semiconductor layer 118 (see FIG. 2B). Here, a case where the oxide semiconductor layer 106, the silicon layer 110, and the impurity semiconductor layer 117 are etched using a resist mask 171 is described. Therefore, edge surfaces of the island-shaped oxide semiconductor layer 108, the silicon layer 112, and the impurity semiconductor layer 118 are aligned substantially.

Figure 2C:
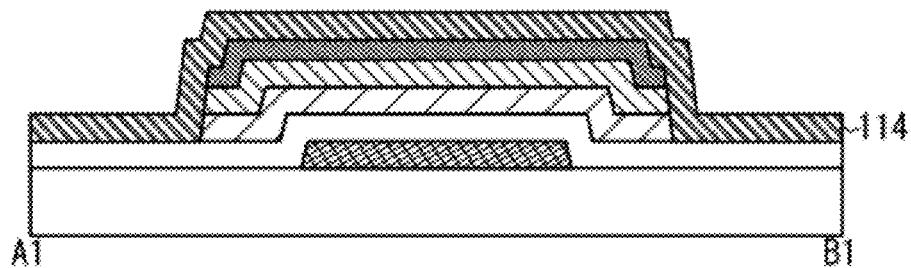

Next, a conductive film 114 is formed so as to cover the impurity semiconductor layer 118 (see FIG. 2C).

The conductive film 114 can be formed by a sputtering method, a vacuum evaporation method, or the like using metal including an element selected from aluminum (Al), copper (Cu), titanium (Ti), tantalum (Ta), tungsten (W), molybdenum (Mo), chromium (Cr), neodymium (Nd), and scandium (Sc); an alloy including the above element as a component; or a material including a nitride or the like in which the above element is included.

For example, the conductive film 114 can be formed to have a single-layer structure of a molybdenum film or a titanium film. The conductive film 114 may be formed to have a stacked structure and, for example, can be formed to have a stacked structure of an aluminum film and a titanium film. Alternatively, a three-layer structure in which a titanium film, an aluminum film, and a titanium film are sequentially stacked may be used. A three-layer structure in which a molybdenum film, an aluminum film, and a molybdenum film are sequentially stacked may be used. As the aluminum films used for these stacked structures, an aluminum film including neodymium (Al—Nd) may be used. Further alternatively, the conductive film 114 may be formed to have a single-layer structure of an aluminum film including silicon.

The conductive film 114 may be formed using a material having high conductivity and a light-transmitting property to visible light. As such a material, indium tin oxide (ITO), indium tin oxide containing silicon oxide (ITSO), organoindium, organotin, zinc oxide (ZnO), or the like can be used for example.

Figure 2D:
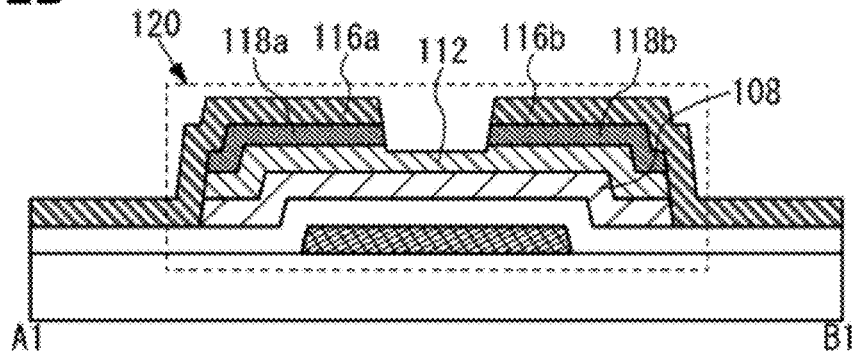

Next, the conductive film 114 and the impurity semiconductor layer 118 are etched to form the first impurity semiconductor layer 118a, the second impurity semiconductor layer 118b, the source electrode layer 116a electrically connected to the first impurity semiconductor layer 118a, and the drain electrode layer 116b electrically connected to the second impurity semiconductor layer 118b (see FIG. 2D). At this time, depending on the etching conditions, the silicon layer 112 might also be etched and reduced in thickness at the time of etching of the conductive film 114 and the impurity semiconductor layer 118. Here, a case where the silicon layer 112 is also etched and reduced in thickness at the time of etching of the conductive film 114 and the impurity semiconductor layer 118 is described.

In the above-described step, the silicon layer 112 serves as a channel protective layer (a channel stop layer) which suppresses etching of the oxide semiconductor layer 108 when the conductive film 114 and the impurity semiconductor layer 118 are etched.

Thus, by providing the silicon layer 112 in contact with the oxide semiconductor layer 108, entry of an unintended element such as hydrogen to the oxide semiconductor layer 108 from the outside can be suppressed.

Through the above-described process, the transistor 120 can be manufactured.

Further, a protective insulating layer may be formed so as to cover the transistor 120. For example, a single layer or a stacked layer of a silicon oxide film, a silicon nitride film, a silicon oxynitride film, a silicon nitride oxide film, an aluminum oxide film, an aluminum nitride film, an aluminum oxynitride film, or an aluminum nitride oxide film may be formed by a CVD method, a sputtering method, or the like as the protective insulating layer.

In the process of FIGS. 2A to 2D, after formation of the oxide semiconductor layer 108, it is preferable to perform heat treatment at 100° C. to 600° C. inclusive, typically 200° C. to 400° C. inclusive in a nitrogen atmosphere or an air atmosphere. For example, heat treatment can be performed at 350° C. in a nitrogen atmosphere for 1 hour. This heat treatment is important because rearrangement at the atomic level of the island-shaped oxide semiconductor layer 108 is caused and distortion that interrupts carrier movement in the oxide semiconductor layer 108 can be reduced.

There is no particular limitation on the timing of the heat treatment as long as it is performed after the formation of the oxide semiconductor layer 106, and the heat treatment may be performed after the formation of the silicon layer 110, the formation of the island-shaped silicon layer 112, the formation of the conductive film 114, the formation of the source electrode layer 116a and the drain electrode layer 116b, or the formation of the protective insulating layer. Depending on the conditions or the like of the heat treatment, a mixed layer of the oxide semiconductor layer 108 and the silicon layer 112 (e.g., an oxide of silicon or the like) might be formed thin at an interface between the oxide semiconductor layer 108 and the silicon layer 112.

Then, various electrodes and wirings are formed, whereby a semiconductor device including the transistor 120 is completed.

Although description has been made with reference to FIGS. 1A and 1B in this embodiment, the structure of the transistor described in this embodiment is not limited to the one illustrated in FIGS. 1A and 1B.

Figure 3A:
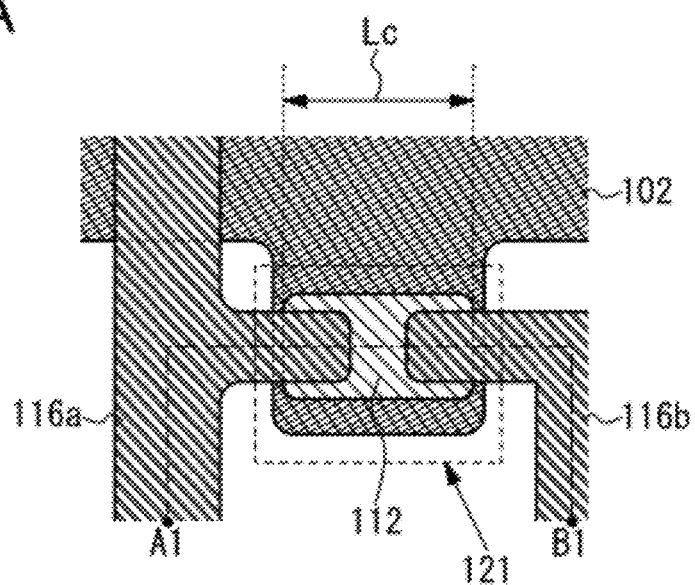
FIGS. 3A and 3B illustrate a structure of a transistor according to Embodiment 1.
Figure 3B:
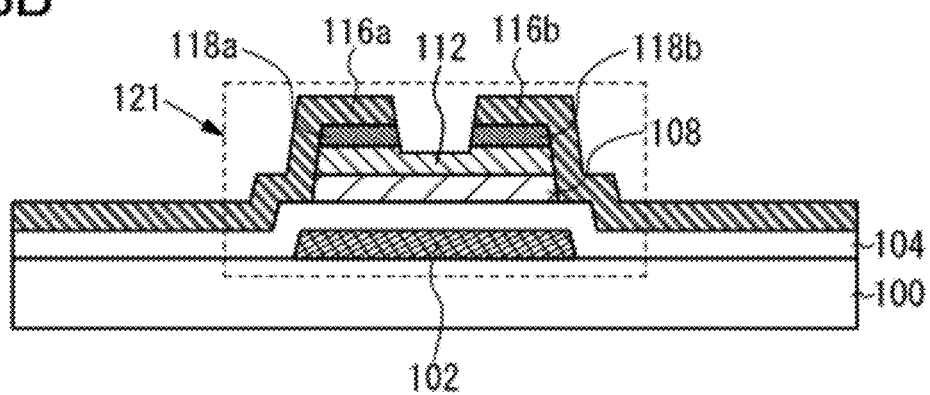

FIGS. 1A and 1B illustrate the case where the length of the oxide semiconductor layer 108 (Lc) is made large so that the oxide semiconductor layer 108 extends beyond edges of the gate electrode 102 in the channel length direction; however, as in a transistor 121 illustrated in FIGS. 3A and 3B, the length of the oxide semiconductor layer 108 (Lc) may be made small and the whole region of the oxide semiconductor layer 108 may be located over the gate electrode 102. Note that FIG. 3A is a top view and FIG. 3B is a cross-sectional view taken along line A1-B1 of FIG. 3A.

Figure 4A:
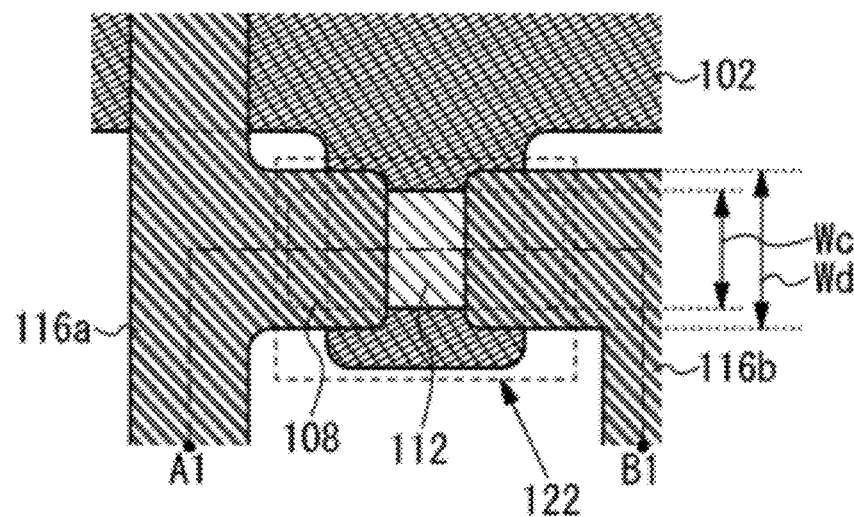
FIGS. 4A and 4B each illustrate a structure of a transistor according to Embodiment 1.
Figure 4B:
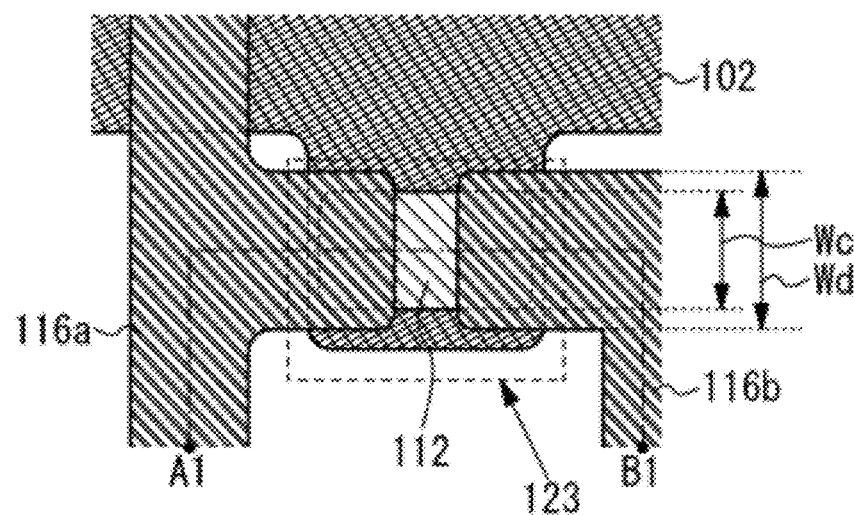

In the structures of FIGS. 1A and 1B and FIGS. 3A and 3B, the widths of the source electrode layer 116a and the drain electrode layer 116b (Wd) may each be larger than the width of the oxide semiconductor layer 108 (Wc) in regions where the source electrode layer 116a and the drain electrode layer 116b overlap with the oxide semiconductor layer 108 (see FIGS. 4A and 4B). In a transistor 122 and a transistor 123 illustrated in FIGS. 4A and 4B respectively, regions of the oxide semiconductor layer 108, which the silicon layer 112 is not in contact with, can be covered with the source electrode layer 116a and the drain electrode layer 116b; accordingly, there is an advantage that the oxide semiconductor layer 108 is protected and thereby reliability is improved. Further, contact resistance between the oxide semiconductor layer 108 and the source and drain electrode layers 116a and 116b can be reduced by the increase in the contact area between the oxide semiconductor layer 108 and the source and drain electrode layers 116a and 116b.

Note that the length of the oxide semiconductor layer 108 (Lc) indicates the length of the oxide semiconductor layer 108 in the channel length direction. The width of the oxide semiconductor layer 108 (Wc) and the widths of the source electrode layer 116a and the drain electrode layer 116b (Wd) indicate the length of the oxide semiconductor layer 108 and the lengths of the source electrode layer 116a and the drain electrode layer 116b, respectively, in the channel width direction. Furthermore, the channel length direction indicates the direction which is generally parallel to the direction in which carriers move in the transistor 120 (the direction in which the source electrode layer 116a and the drain electrode layer 116b are connected to each other), and the channel width direction indicates the direction which is generally perpendicular to the channel length direction.

Figure 5A:
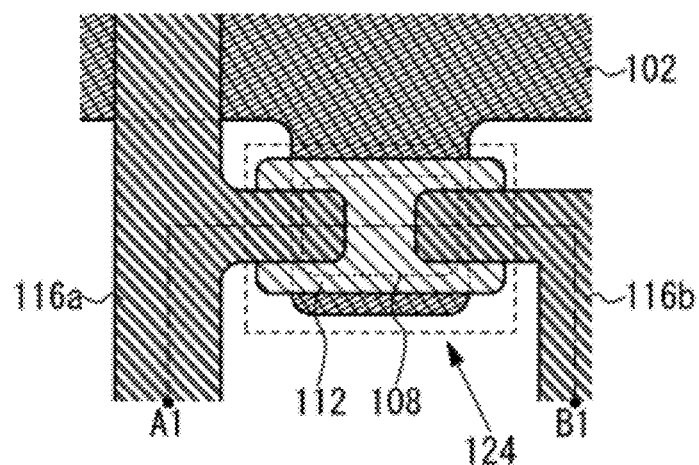
FIGS. 5A and 5B illustrate a structure of a transistor according to Embodiment 1.
Figure 5B:
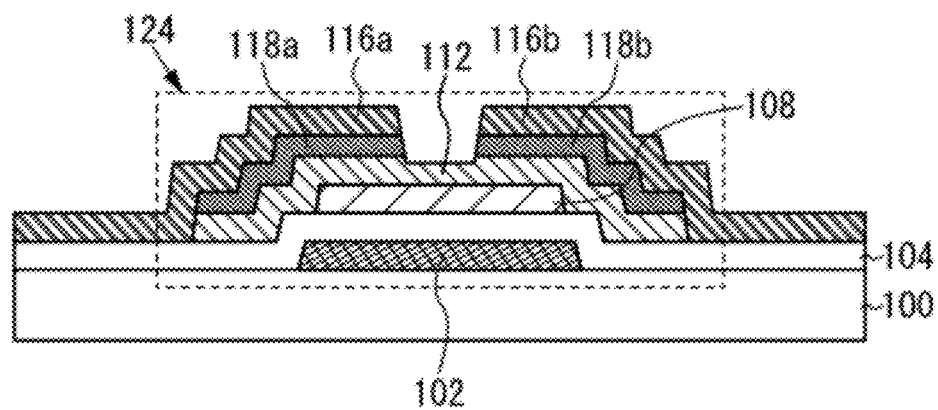

Although the case where the edge surfaces of the oxide semiconductor layer 108 and the silicon layer 112 are provided to be aligned substantially is described in FIGS. 1A and 1B, the present invention is not limited thereto. For example, the silicon layer 112 may be provided so as to cover the edge portion (the edge surface) of the oxide semiconductor layer 108, like a transistor 124 illustrated in FIGS. 5A and 5B. In this case, in FIG. 2A, after the oxide semiconductor layer 106 is formed over the gate insulating layer 104, etching may be performed to form the island-shaped oxide semiconductor layer 108, and then the silicon layer 110 and the impurity semiconductor layer 117 may be formed to be stacked over the island-shaped oxide semiconductor layer 108. FIG. 5A is a top view, and FIG. 5B is a cross-sectional view taken along line A1-B1 of FIG. 5A.

This embodiment can be implemented in combination with any of the other structures described in other embodiments, as appropriate.

Embodiment 2

In this embodiment, a structure and a manufacturing method of a transistor which are different from those of Embodiment 1 will be described with reference to the drawings.

First, the manufacturing method of the transistor will be described with reference to FIGS. 6A to 6E. Note that the manufacturing process (such as applicable materials) described in this embodiment is in common with that of Embodiment 1 in many points. Thus, description of the common points are omitted below and only points different from those of Embodiment 1 will be described in detail.

Figure 6A:
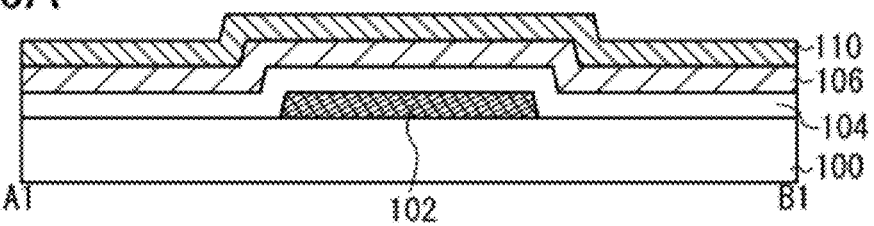
FIGS. 6A to 6E illustrate an example of a manufacturing method of a transistor according to Embodiment 2.

First, a gate electrode 102 is formed over a substrate 100, and then a gate insulating layer 104, an oxide semiconductor layer 106, and a silicon layer 110 are sequentially formed to be stacked over the gate electrode 102 (see FIG. 6A).

Figure 6B:
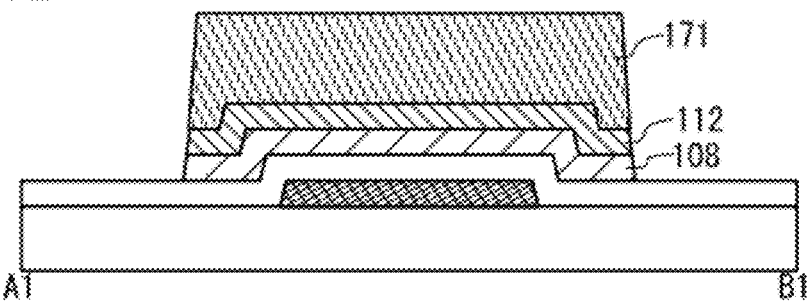

Next, the oxide semiconductor layer 106 and the silicon layer 110 are etched to form an island-shaped oxide semiconductor layer 108 and an island-shaped silicon layer 112 (see FIG. 6B). Here, a case where the oxide semiconductor layer 106 and the silicon layer 110 are etched using a resist mask 171 is described. Therefore, edge surfaces of the island-shaped oxide semiconductor layer 108 and the silicon layer 112 are aligned substantially.

Figure 6C:
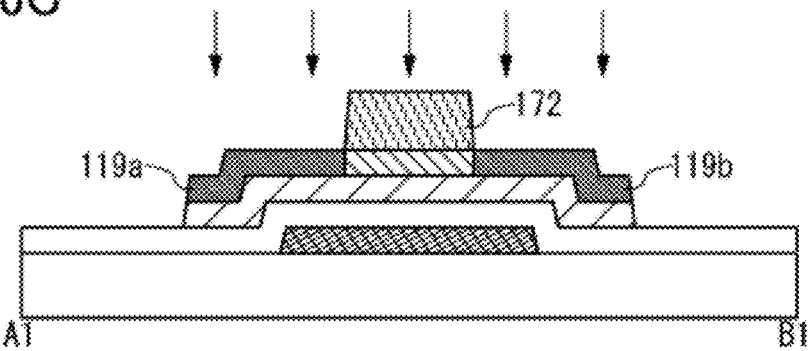

Next, after a resist mask 172 is formed over the silicon layer 112, an impurity element is added to the silicon layer 112 using the resist mask 172, whereby an impurity region 119a and an impurity region 119b which have low resistivity are formed in the silicon layer 112 (see FIG. 6C).

For example, phosphorus, arsenic, or the like is added to the silicon layer 112 by an ion doping method or an ion implantation method, so that the impurity regions 119a and 119b having n-type conductivity can be formed with an intrinsic region interposed therebetween. For example, phosphorus is added so as to be contained in the impurity regions 119a and 119b at a concentration of $1 \times 10^{17}$ atoms/cm$^3$ to $1 \times 10^{22}$ atoms/cm$^3$ inclusive.

Figure 6D:
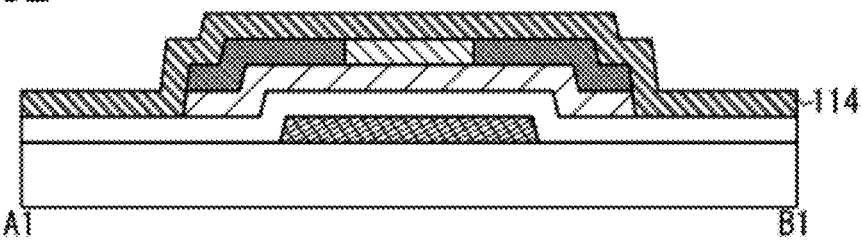

Then, a conductive film 114 is formed so as to cover the silicon layer 112 (see FIG. 6D).

Figure 6E:
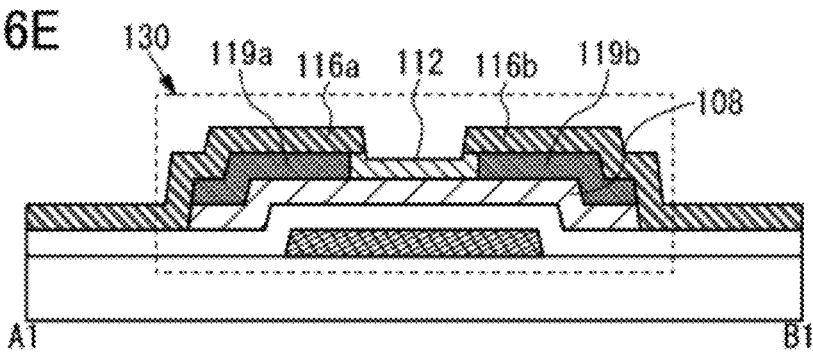

Next, the conductive film 114 is etched to form a source electrode layer 116a and a drain electrode layer 116b (see FIG. 6E). At this time, depending on the etching conditions, the silicon layer 112 might also be etched and reduced in thickness at the time of etching of the conductive film 114. Here, a case where the silicon layer 112 is also etched and reduced in thickness at the time of etching of the conductive film 114 is described.

In the above-described step, the silicon layer 112 serves as a channel protective layer (a channel stop layer) which suppresses etching of the oxide semiconductor layer 108 when the conductive film 114 is etched.

Figure 7A:
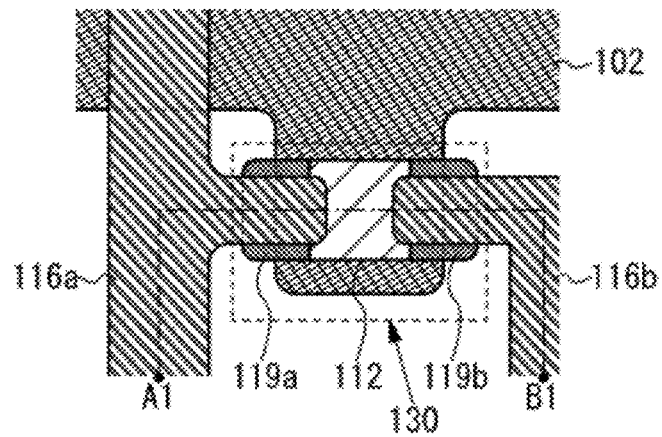
FIGS. 7A to 7C illustrate structures of a transistor according to Embodiment 2.
Figure 7B:
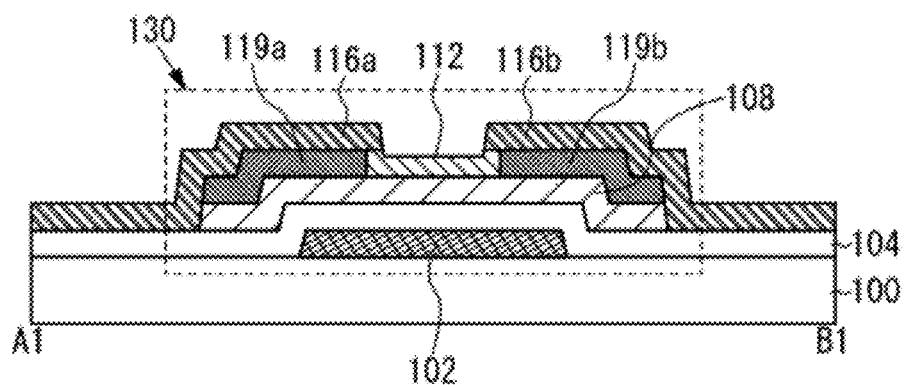
Figure 7C:
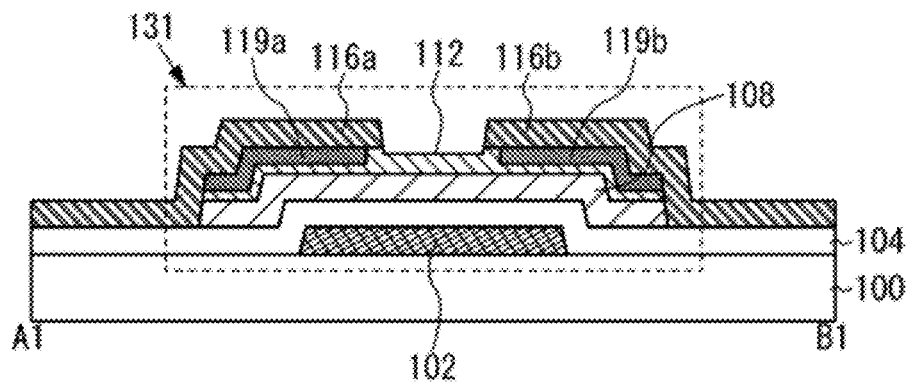

Through the above-described process, a transistor 130 as illustrated in FIGS. 7A and 7B can be manufactured. As in a transistor 131 illustrated in FIG. 7C, an n-type impurity element may be selectively added to an upper portion of the silicon layer 112 to form the impurity regions 119a and 119b having n-type conductivity on the surface side of the silicon layer 112. FIG. 7A is a top view, and FIGS. 7B and 7C are cross-sectional views taken along line A1-B1 of FIG. 7A.

After formation of the transistor 130 or the transistor 131, a protective insulating layer may be formed so as to cover the transistor 130 or the transistor 131. In the process of FIGS. 6A to 6E, heat treatment may be performed in a nitrogen atmosphere or an air atmosphere after the oxide semiconductor layer 108 is formed. Further, it is preferable to perform heat treatment for activation after the impurity element is added to the silicon layer 112.

This embodiment can be implemented in combination with any of the other structures described in other embodiments, as appropriate.

Embodiment 3

In this embodiment, a manufacturing process of a display device which is an example of a usage pattern of a semiconductor device including the transistor described in Embodiment 1 or 2 will be described with reference to the drawings. Note that the manufacturing process (such as applicable materials) described in this embodiment is in common with that of Embodiment 1 in many points. Thus, description of the common points are omitted below and only points different from those of Embodiment 1 will be described in detail. In the description below, FIGS. 8A to 8C and FIGS. 9A to 9C are cross-sectional views, and FIG. 10, FIG. 11, FIG. 12, and FIG. 13 are top views.

Figure 10:
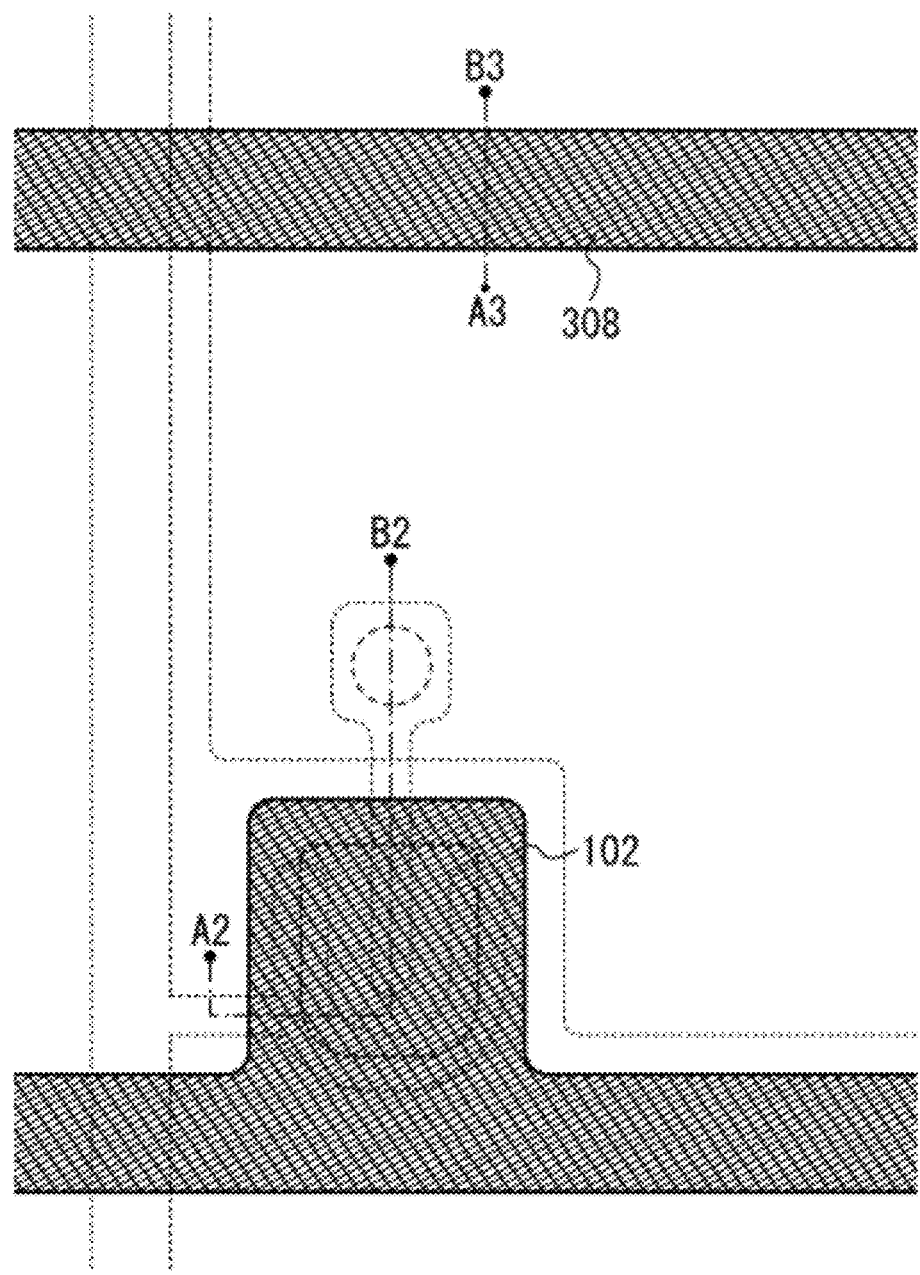
FIG. 10 illustrates an example of a manufacturing method of a semiconductor device according to Embodiment 3.

First, wirings and electrodes (a gate wiring including the gate electrode 102, a capacitor wiring 308, and a first terminal 321) are formed over the substrate 100 having an insulating surface, and then the gate insulating layer 104, the oxide semiconductor layer 106, the silicon layer 110, and the impurity semiconductor layer 117 are sequentially formed to be stacked (see FIG. 8A and FIG. 10).

The capacitor wiring 308 and the first terminal 321 can be formed using the same material as that of the gate electrode 102, simultaneously.

Figure 11:
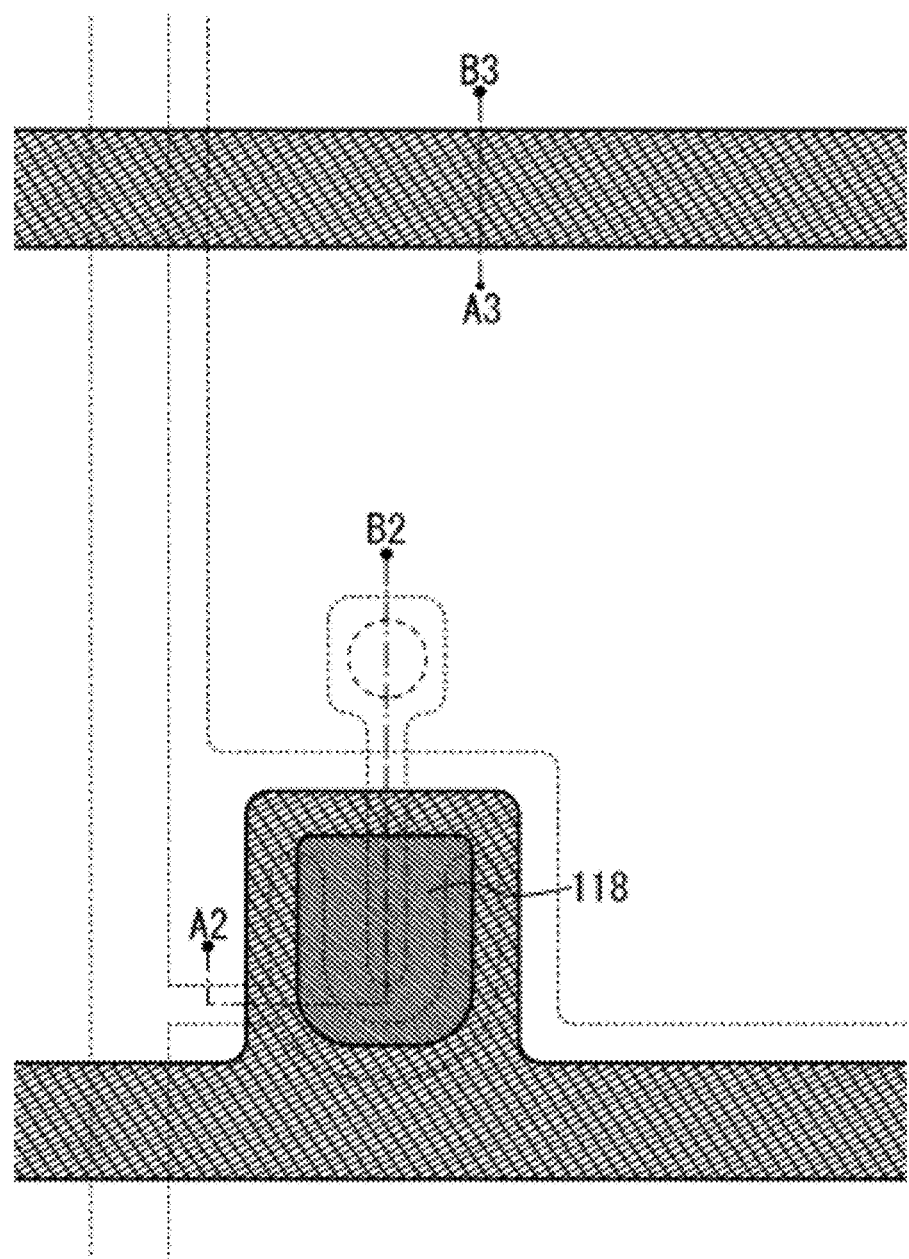
FIG. 11 illustrates an example of a manufacturing method of a semiconductor device according to Embodiment 3.

Next, the oxide semiconductor layer 106, the silicon layer 110, and the impurity semiconductor layer 117 are etched to form the island-shaped oxide semiconductor layer 108, the island-shaped silicon layer 112, and the island-shaped impurity semiconductor layer 118 (see FIG. 8B and FIG. 11). Here, a case where the oxide semiconductor layer 106, the silicon layer 110, and the impurity semiconductor layer 117 are etched using a resist mask is described. Therefore, edge surfaces of the island-shaped oxide semiconductor layer 108, the silicon layer 112, and the impurity semiconductor layer 118 are aligned substantially.

After a contact hole 313 is formed in the gate insulating layer 104 so as to expose the first terminal 321, the conductive film 114 is formed so as to cover the gate insulating layer 104, the oxide semiconductor layer 108, and the silicon layer 112 (see FIG. 8C). Thus, the conductive film 114 and the first terminal 321 are electrically connected to each other through the contact hole 313.

Figure 12:
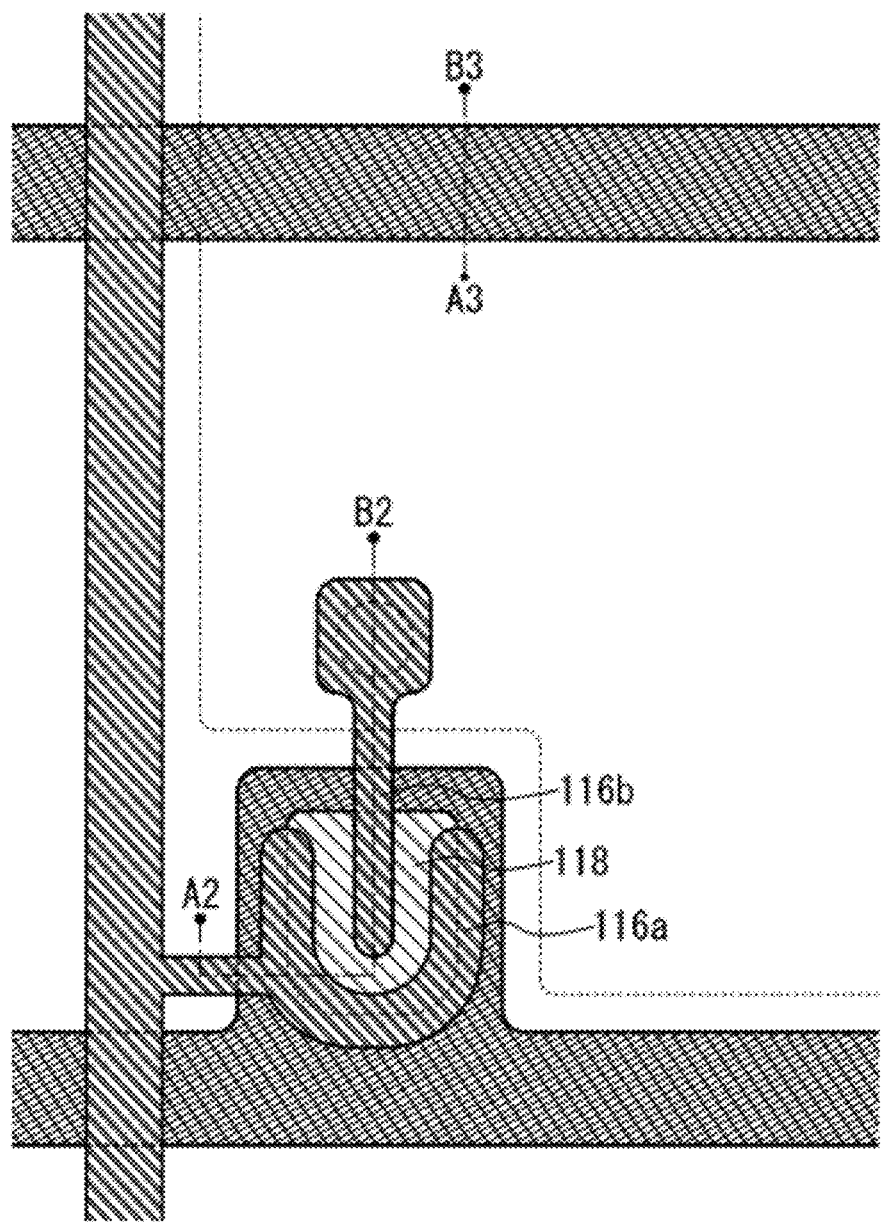
FIG. 12 illustrates an example of a manufacturing method of a semiconductor device according to Embodiment 3.

Next, the conductive film 114 and the impurity semiconductor layer 118 are etched to form the first impurity semiconductor layer 118a, the second impurity semiconductor layer 118b, the source electrode layer 116a electrically connected to the first impurity semiconductor layer 118a, and the drain electrode layer 116b electrically connected to the second impurity semiconductor layer 118b (see FIG. 9A and FIG. 12). At this time, the silicon layer 112 serves as a channel protective layer for the oxide semiconductor layer 108.

A second terminal 322 can be electrically connected to a source wiring (a source wiring including the source electrode layer 116a). A connection electrode 320 can be directly connected to the first terminal 321.

Through the above process, the thin film transistor 160 can be manufactured.

Next, heat treatment is preferably performed at 200° C. to 600° C., typically, 300° C. to 500° C. For example, heat treatment is performed under a nitrogen atmosphere at 350° C. for one hour. By this heat treatment, rearrangement of the In—Ga—Zn—O based non-single-crystal film forming the oxide semiconductor layer 108 is performed at the atomic level. This heat treatment (which may be light annealing) is effective because distortion which hinders the transfer of carriers is reduced by this heat treatment. Note that there is no particular limitation on the timing to perform the heat treatment as long as it is after the formation of the oxide semiconductor layer 106, and for example, the heat treatment may be performed after a pixel electrode is formed.

Next, a protective insulating layer 340 is formed so as to cover the transistor 160, and the protective insulating layer 340 is selectively etched to form a contact hole 325 which reaches the drain electrode layer 116b, a contact hole 326 which reaches the connection electrode 320, and a contact hole 327 which reaches the second terminal 322 (see FIG. 9B).

Figure 13:
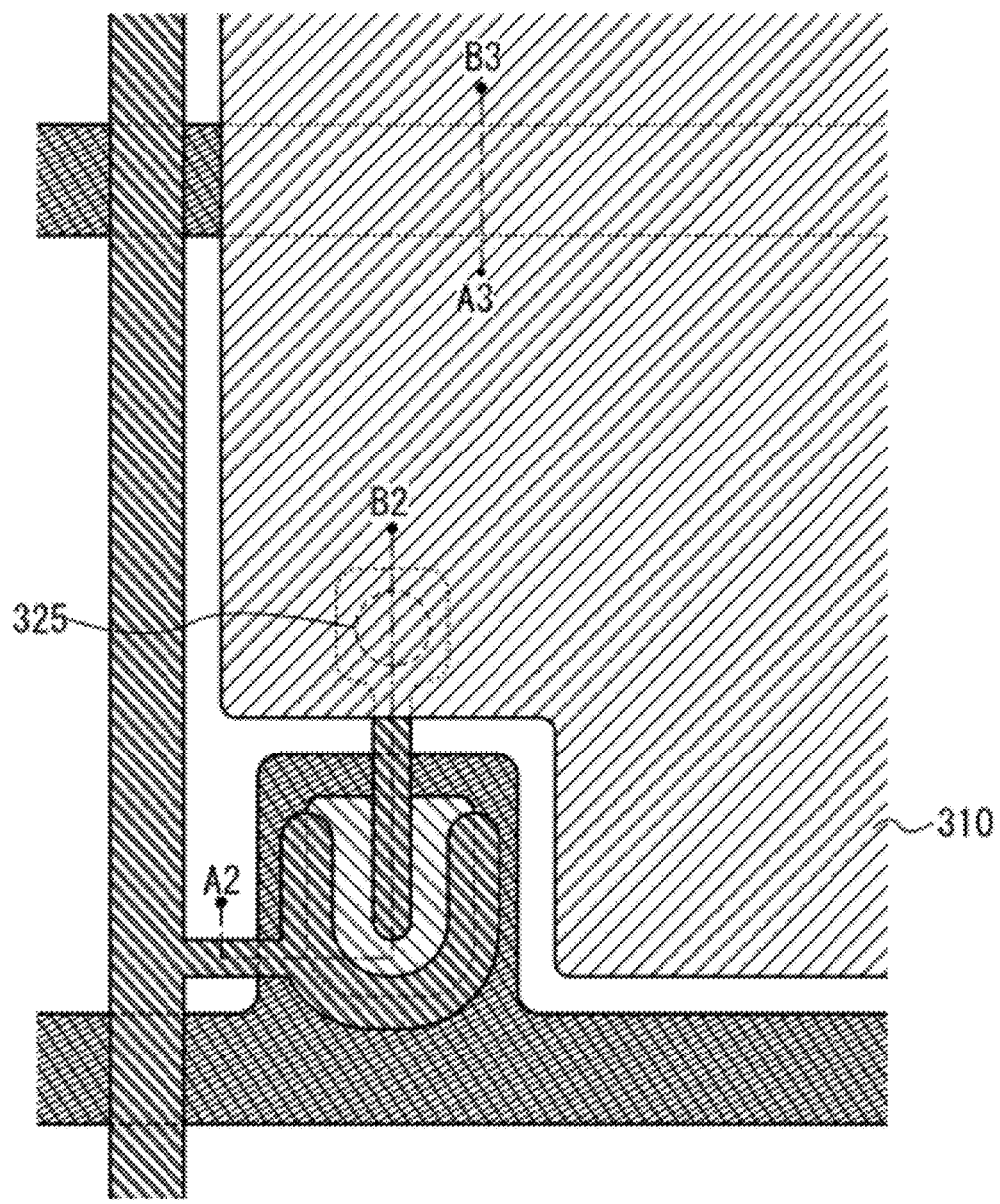
FIG. 13 illustrates an example of a manufacturing method of a semiconductor device according to Embodiment 3.

Next, a transparent conductive layer 310 which is electrically connected to the drain electrode layer 116b, a transparent conductive layer 328 which is electrically connected to the connection electrode 320, and a transparent conductive layer 329 which is electrically connected to the second terminal 322 are formed (see FIG. 9C and FIG. 13).

The transparent conductive layer 310 functions as a pixel electrode, and the transparent conductive layers 328 and 329 serve as electrodes or wirings used for connection with an FPC. More specifically, the transparent conductive layer 328 formed over the connection electrode 320 can be used as a terminal electrode for connection which functions as an input terminal of a gate wiring, and the transparent conductive layer 329 formed over the second terminal 322 can be used as a terminal electrode for connection which functions as an input terminal of a source wiring.

In addition, a storage capacitor can be formed using the capacitor wiring 308, the gate insulating layer 104, the protective insulating layer 340, and the transparent conductive layer 310. In this case, the capacitor wiring 308 and the transparent conductive layer 310 each serve as an electrode, and the gate insulating layer 104 and the protective insulating layer 340 each serve as a dielectric.

The transparent conductive layers 310, 328, and 329 can be formed using indium oxide ($In_2O_3$), an alloy of indium oxide and tin oxide ($In_2O_3$—$SnO_2$, abbreviated as ITO), an alloy of indium oxide and zinc oxide ($In_2O_3$—ZnO), or the like by a sputtering method, a vacuum evaporation method, or the like. For example, a transparent conductive film is formed, and then a resist mask is formed over the transparent conductive film. Then, an unnecessary portion is removed by etching, whereby the transparent conductive layers 310, 328, and 329 can be formed.

Through the above process, elements such as a bottom-gate n-channel thin film transistor and the storage capacitor can be completed. By arranging these elements in matrix corresponding to respective pixels, an active matrix display device can be manufactured.

This embodiment can be implemented in combination with any of the structures of the other embodiments as appropriate.

Embodiment 4

In this embodiment, an example of a liquid crystal display device will be described as a semiconductor device including a thin film transistor. First, the appearance and a cross section of a liquid crystal display panel, which is one mode of the semiconductor device, will be described with reference to FIGS. 14A1, 14A2, and 14B. FIGS. 14A1 and 14A2 are each a top view of a panel in which thin film transistors 4010 and 4011 which include an oxide semiconductor layer, and a liquid crystal element 4013, which are formed over a first substrate 4001, are sealed between the first substrate 4001 and a second substrate 4006 with a sealant 4005. FIG. 14B corresponds to a cross-sectional view taken along line M-N of FIGS. 14A1 and 14A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 as well as a liquid crystal layer 4008 are sealed between the first substrate 4001 and the second substrate 4006 with the sealant 4005. A signal line driver circuit 4003 that is formed using a single crystal semiconductor film or a polycrystalline semiconductor film over a substrate which is prepared separately is mounted in a region that is different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 14A1 illustrates an example in which the signal line driver circuit 4003 is mounted by a COG method, and FIG. 14A2 illustrates an example in which the signal line driver circuit 4003 is mounted by a TAB method.

Each of the pixel portion 4002 and the scan line driver circuit 4004 which are provided over the first substrate 4001 includes a plurality of thin film transistors. FIG. 14B illustrates the thin film transistor 4010 included in the pixel portion 4002 and the thin film transistor 4011 included in the scan line driver circuit 4004. Insulating layers 4020 and 4021 are provided over the thin film transistors 4010 and 4011.

Any of the structures described in the above embodiments can be applied to the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap corresponds to the liquid crystal element 4013. Note that the pixel electrode layer 4030 and the counter electrode layer 4031 are provided with insulating layers 4032 and 4033 which function as alignment films, respectively, and the liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be formed using glass, metal (typically, stainless steel), ceramic, or plastic. As for plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A columnar spacer denoted by reference numeral 4035 is obtained by selective etching of an insulating film and is provided to control a distance (a cell gap) between the pixel electrode layer 4030 and the counter electrode layer 4031. Note that a spherical spacer may also be used. In addition, the counter electrode layer 4031 is electrically connected to a common potential line provided on the same substrate as the thin film transistor 4010. With the use of a common connection portion, the counter electrode layer 4031 and the common potential line can be electrically connected to each other through conductive particles arranged between a pair of substrates. Note that the conductive particles are included in the sealant 4005.

In addition, liquid crystal exhibiting a blue phase for which an alignment film is not unnecessary may be used. The blue phase is one of liquid crystal phases and a phase which appears just before the transition from a cholesteric phase to an isotropic phase when the temperature of cholesteric liquid crystal is increased. Because the blue phase appears only in a small temperature range, a liquid crystal composition in which greater than or equal to 5 weight % of a chiral agent is mixed is used for the liquid crystal layer 4008 in order to improve the temperature range. The liquid crystal composition including liquid crystal exhibiting a blue phase and a chiral agent has a short response time of 10 μs to 100 μs and are optically isotropic; therefore, alignment treatment is unnecessary, and viewing angle dependence is small.

Note that the liquid crystal display device described in this embodiment is an example of a transmissive liquid crystal display device; however, the liquid crystal display device can be applied to either a reflective liquid crystal display device or a semi-transmissive liquid crystal display device.

The liquid crystal display device described in this embodiment is an example in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked structure of the polarizing plate and the coloring layer is also not limited to this embodiment and may be appropriately set depending on materials of the polarizing plate and the coloring layer or conditions of the manufacturing process. In addition, a light-blocking film which functions as a black matrix may be provided.

In this embodiment, in order to reduce surface unevenness of the thin film transistors and to improve reliability of the thin film transistors, the thin film transistors are covered with the insulating layers (the insulating layer 4020 and the insulating layer 4021) functioning as a protective film or a planarizing insulating film. Note that the protective film is provided to prevent entry of a contaminant impurity such as an organic substance, a metal substance, or moisture floating in air and is preferably a dense film. As the protective film, a single layer or a stacked layer of any of a silicon oxide film, a silicon nitride film, a silicon oxynitride film, a silicon nitride oxide film, an aluminum oxide film, an aluminum nitride film, an aluminum oxynitride film, or an aluminum nitride oxide film may be formed by a sputtering method. In this embodiment, an example in which the protective film is formed by a sputtering method is described; however, there is no particular limitation on the method, and a variety of methods may be used.

Here, the insulating layer 4020 having a stacked structure is formed as the protective film. Here, a silicon oxide film is formed by a sputtering method, as a first layer of the insulating layer 4020. When the silicon oxide film is used as the protective film, the silicon oxide film has an effect of preventing a hillock of an aluminum film used as a source electrode layer and a drain electrode layer.

An insulating layer is formed as a second layer of the protective film. Here, a silicon nitride film is formed by a sputtering method, as a second layer of the insulating layer 4020. The use of the silicon nitride film as the protective film can prevent mobile ions of sodium or the like from entering a semiconductor region so that variation in electric characteristics of a TFT can be suppressed.

After the protective film is formed, annealing (200° C. to 400° C.) of the semiconductor layer may be performed.

The insulating layer 4021 is formed as the planarizing insulating film. An organic material having heat resistance, such as polyimide, acrylic, benzocyclobutene, polyamide, or epoxy can be used for the insulating layer 4021. In addition to such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed of these materials.

Note that a siloxane-based resin is a resin formed using a siloxane-based material as a starting material and having the bond of Si—O—Si. As for the siloxane-based resin, an organic group (e.g., an alkyl group or an aryl group) or a fluoro group may be used as a substituent. The organic group may include a fluoro group.

There is no particular limitation on the method for forming the insulating layer 4021, and the following method can be used depending on the material of the insulating layer 4021: a sputtering method, an SOG method, a spin coating method, a dip coating method, a spray coating method, a droplet discharge method (e.g., an inkjet method, screen printing, offset printing, or the like), a doctor knife, a roll coater, a curtain coater, a knife coater, or the like. When the insulating layer 4021 is formed using material liquid, annealing (200° C. to 400° C.) of the semiconductor layer may be performed in a baking step at the same time. A baking step of the insulating layer 4021 also serves as the annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition including a conductive high molecule (also referred to as a conductive polymer) can be used for the pixel electrode layer 4030 and the counter electrode layer 4031. The pixel electrode formed using a conductive composition preferably has a light transmittance of greater than or equal to 70% at a wavelength of 550 nm. Further, the resistivity of the conductive polymer included in the conductive composition is preferably less than or equal to 0.1 Ω·cm.

As the conductive polymer, a so-called π-electron conjugated conductive polymer can be used. As examples thereof, polyaniline or a derivative thereof, polypyrrole or a derivative thereof, polythiophene or a derivative thereof, a copolymer of more than two kinds of them, and the like can be given.

Further, a variety of signals and potentials are supplied to the signal line driver circuit 4003 which is formed separately, the scan line driver circuit 4004 or the pixel portion 4002 from an FPC 4018.

In this embodiment, a connection terminal electrode 4015 is formed using the same conductive film as the pixel electrode layer 4030 included in the liquid crystal element 4013. A terminal electrode 4016 is formed using the same conductive film as the source and drain electrode layers included in the thin film transistors 4010 and 4011.

The connection terminal electrode 4015 is electrically connected to a terminal included in the FPC 4018 through an anisotropic conductive film 4019.

FIGS. 14A1, 14A2, and 14B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

This embodiment can be implemented in combination with any of the structures of the other embodiments as appropriate.

Embodiment 5

In this embodiment, electronic paper is described as an example of a semiconductor device including a transistor.

Figure 18:
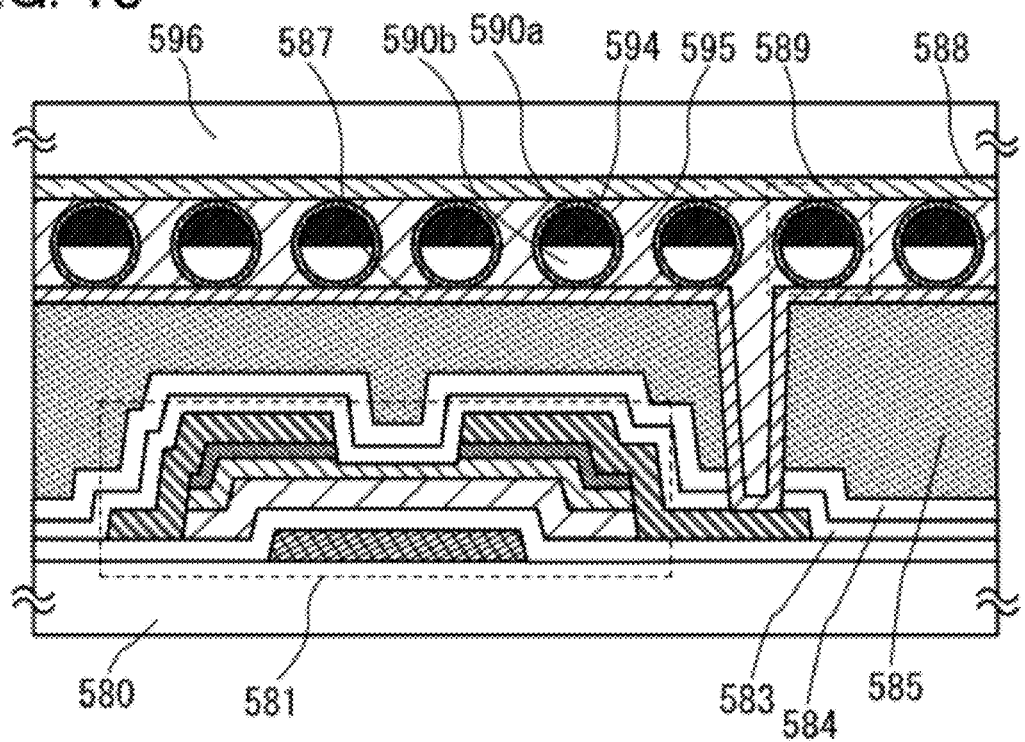
FIG. 18 illustrates an example of a semiconductor device according to Embodiment 5.

FIG. 18 illustrates active matrix electronic paper as an example of the semiconductor device. A thin film transistor 581 used for the semiconductor device can be formed in a manner similar to the thin film transistor described in any of Embodiments 1 to 3.

The electronic paper in FIG. 18 is an example of a display device using a twisting ball display system. The twisting ball display system refers to a method in which spherical particles each colored in black and white are arranged between a first electrode layer and a second electrode layer which are used for a display element, and a potential difference is generated between the first electrode layer and the second electrode layer to control orientation of the spherical particles, so that display is performed.

The thin film transistor 581 provided over a substrate 580 is a thin film transistor having a bottom gate structure. A source electrode layer or a drain electrode layer is electrically connected to a first electrode layer 587 through a contact hole formed in insulating layers 583, 584, and 585. Between the first electrode layer 587 and a second electrode layer 588, spherical particles 589 each including a black region 590a and a white region 590b, and a cavity 594 filled with liquid around the black region 590a and the white region 590b are provided. The circumference of each of the spherical particles 589 is provided with a filler 595 such as a resin (see FIG. 18). In FIG. 18, the first electrode layer 587 corresponds to a pixel electrode, and the second electrode layer 588 corresponds to a common electrode. The second electrode layer 588 is electrically connected to a common potential line provided on the same substrate as the thin film transistor 581. A common connection portion described in the above embodiment is used, whereby the second electrode layer 588 provided on a substrate 596 and the common potential line can be electrically connected to each other through the conductive particles arranged between a pair of substrates.

Further, instead of the twist ball, an electrophoretic element can also be used. In that case, a microcapsule having a diameter of approximately 10 μm to 200 μm, in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element, and is called electronic paper in general. The electrophoretic display element has higher reflectance than a liquid crystal display element, and thus, an assistant light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device including a display device) is distanced from an electric wave source.

In this manner, highly reliable electronic paper can be manufactured as a semiconductor device.

This embodiment can be implemented in combination with any of the structures of the other embodiments as appropriate.

Embodiment 6

In this embodiment, an example of a light-emitting display device will be described as a semiconductor device including a transistor. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of voltage to a light-emitting element, electrons and holes are separately injected from a pair of electrodes into a layer containing a light-emitting organic compound, and current flows. Then, the carriers (electrons and holes) are recombined, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission which utilizes a donor level and an acceptor level. The thin-film inorganic EL element has a structure where a light-emitting layer is sandwiched between dielectric layers, which are further sandwiched between electrodes, and its light emission mechanism is localized type light emission which utilizes inner-shell electron transition of metal ions.

Next, the appearance and a cross section of a light-emitting display panel (also referred to as a light-emitting panel), which is one mode of the semiconductor device, will be described with reference to FIGS. 15A and 15B. FIG. 15A is a top view of the panel in which thin film transistors 4509 and 4510 and a light-emitting element 4511 are sealed between a first substrate 4501 and a second substrate 4506 with a sealant 4505. FIG. 15B is a cross-sectional view taken along line H-I of FIG. 15A. Note that description is made here using an organic EL element as a light-emitting element.

The sealant 4505 is provided to surround a pixel portion 4502, signal line driver circuits 4503a and 4503b, and scanning line driver circuits 4504a and 4504b, which are provided over the first substrate 4501. In addition, the second substrate 4506 is provided over the pixel portion 4502, the signal line driver circuits 4503a and 4503b, and the scanning line driver circuits 4504a and 4504b. Accordingly, the pixel portion 4502, the signal line driver circuits 4503a and 4503b, and the scanning line driver circuits 4504a and 4504b are sealed together with a filler 4507, by the first substrate 4501, the sealant 4505, and the second substrate 4506. Thus, it is preferable that the pixel portion 4502, the signal line driver circuits 4503a and 4503b, and the scanning line driver circuits 4504a and 4504b be packaged (sealed) with a protective film (such as a bonding film or an ultraviolet curable resin film) or a cover material with high air-tightness and little degasification so as not to be exposed to the outside air.

The pixel portion 4502, the signal line driver circuits 4503a and 4503b, and the scanning line driver circuits 4504a and 4504b formed over the first substrate 4501 each include a plurality of thin film transistors, and the thin film transistor 4510 included in the pixel portion 4502 and the thin film transistor 4509 included in the signal line driver circuit 4503a are illustrated as an example in FIG. 15B.

Any of the structures described in the above embodiments can be applied to the thin film transistors 4010 and 4011. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that although the light-emitting element 4511 has a stacked structure of the first electrode layer 4517, an electroluminescent layer 4512, and a second electrode layer 4513, the structure of the light-emitting element 4511 is not limited to the structure described in this embodiment. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed of a photosensitive material to have an opening over the first electrode layer 4517 so that a sidewall of the opening is formed as an inclined surface with continuous curvature.

The electroluminescent layer 4512 may be formed using a single layer or a plurality of layers stacked.

A protective film may be formed over the second electrode layer 4513 and the partition 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied to the signal line driver circuits 4503a and 4503b, the scanning line driver circuits 4504a and 4504b, or the pixel portion 4502 from FPCs 4518a and 4518b.

In this embodiment, a connection terminal electrode 4515 is formed using the same conductive film as the first electrode layer 4517 included in the light-emitting element 4511, and a terminal electrode 4516 is formed using the same conductive film as the source and drain electrode layers included in the thin film transistors 4509 and 4510.

The connection terminal electrode 4515 is electrically connected to a terminal included in the FPC 4518a through an anisotropic conductive film 4519.

The second substrate 4506 located in the direction in which light is extracted from the light-emitting element 4511 needs to have a light-transmitting property. In this case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scanning line driver circuits or part thereof may be separately formed and mounted. This embodiment is not limited to the structure illustrated in FIGS. 15A and 15B.

Through the above-described process, a highly reliable light-emitting display device (display panel) as a semiconductor device can be manufactured.

This embodiment can be implemented in combination with any of the structures described in other embodiments as appropriate.

Embodiment 7

A semiconductor device including any of the transistors described in the above embodiments can be applied to a variety of electronic appliances (including an amusement machine). Examples of electronic appliances are a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio reproducing device, a large-sized game machine such as a pachinko machine, and the like.

Figure 16A:
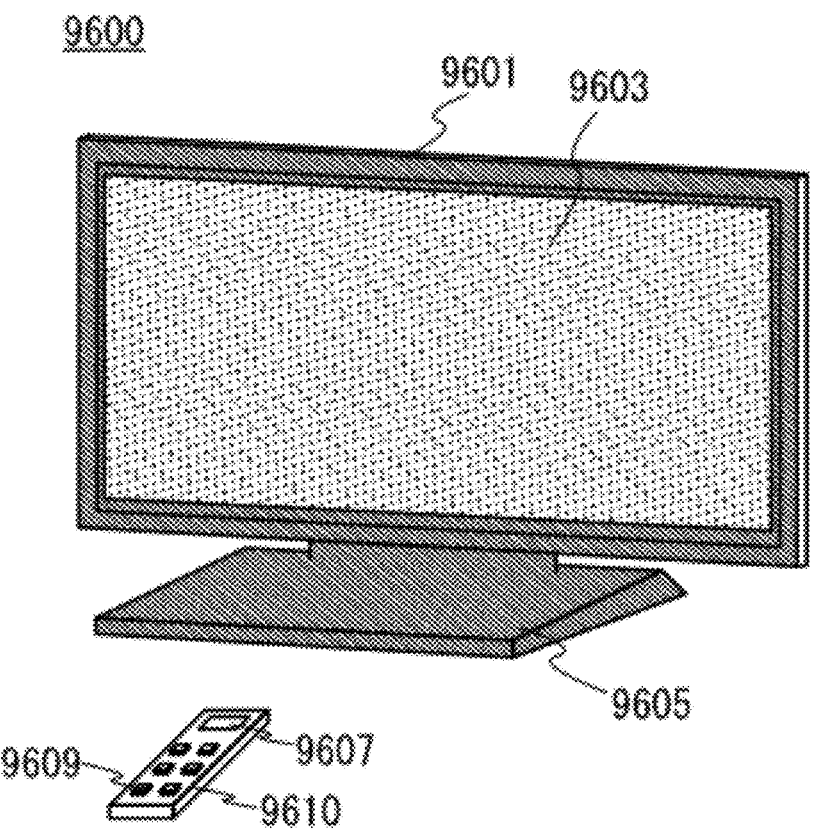
FIGS. 16A and 16B are external views illustrating a television device and a digital photo frame, respectively.

FIG. 16A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated by an operation switch of the housing 9601 or a separate remote controller 9610. Channels and volume can be controlled by an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 16B:
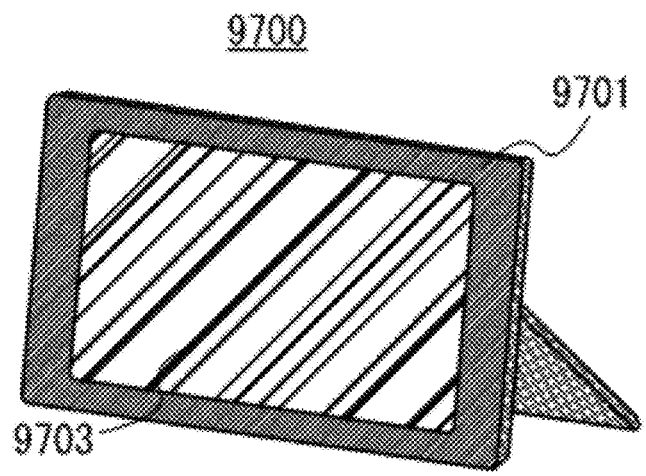

FIG. 16B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection terminal (a USB terminal, a terminal which can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory which stores data of an image shot by a digital camera is inserted in the recording medium insertion portion of the digital photo frame, whereby the image data can be downloaded and displayed on the display portion 9703.

The digital photo frame 9700 may have a configuration capable of wirelessly transmitting and receiving data. Through wireless communication, desired image data can be downloaded to be displayed.

Figure 17A:
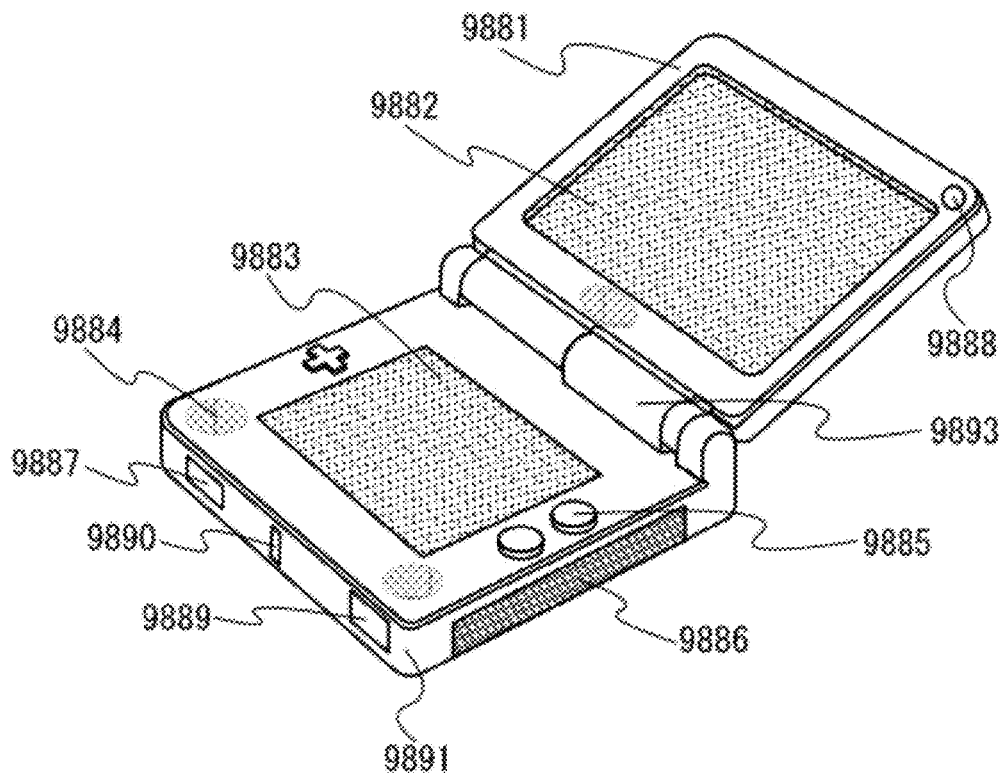
FIGS. 17A and 17B are external views illustrating amusement machines.

FIG. 17A illustrates a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 17A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device may be employed. The portable amusement machine may include another accessory equipment as appropriate. The portable amusement machine illustrated in FIG. 17A has a function of reading a program or data stored in a recording medium to display it on the display portion, and a function of sharing information with another portable amusement machine by wireless communication. The portable amusement machine illustrated in FIG. 17A can have various functions without limitation to the above.

Figure 17B:
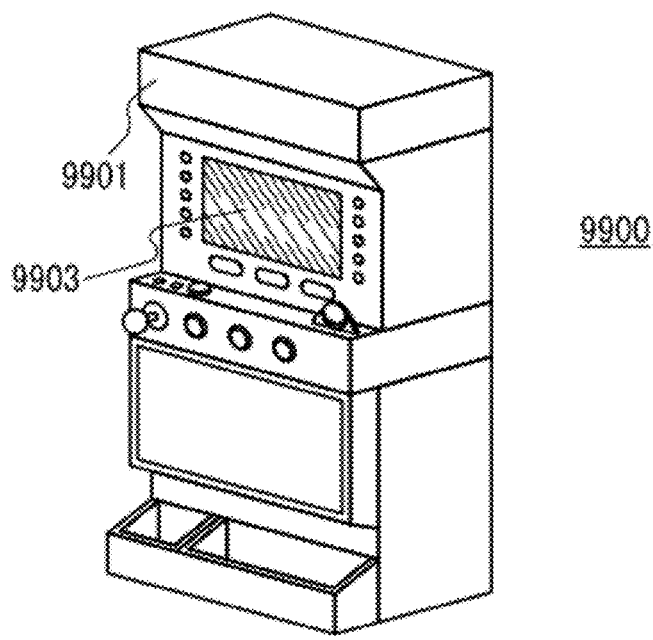

FIG. 17B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device may be employed. The slot machine 9900 may include another accessory equipment as appropriate.

This embodiment can be implemented in combination with any of the structures described in other embodiments as appropriate.

This application is based on Japanese Patent Application serial no. 2009-030968 filed with Japan Patent Office on Feb. 13, 2009, the entire contents of which are hereby incorporated by reference.

What is claimed is:

1. A transistor comprising:
a gate electrode;
a gate insulating layer over the gate electrode;
an oxide semiconductor layer over the gate insulating layer, the oxide semiconductor layer overlapping with the gate electrode;
a silicon layer over and in contact with the oxide semiconductor layer;
a first impurity semiconductor layer over the silicon layer;
a second impurity semiconductor layer over the silicon layer;
a source electrode layer electrically connected to the first impurity semiconductor layer; and
a drain electrode layer electrically connected to the second impurity semiconductor layer.

2. The transistor according to claim 1,
wherein the first impurity semiconductor layer and the second impurity semiconductor layer are silicon layers to which an impurity element is added.

3. The transistor according to claim 1,
wherein the oxide semiconductor layer includes at least one of indium, zinc, and gallium.

4. The transistor according to claim 1,
wherein an edge surface of the oxide semiconductor layer is covered with the silicon layer.

5. A semiconductor device comprising the transistor according to claim 1.

6. A transistor comprising;
a gate electrode;
a gate insulating layer over the gate electrode;
an oxide semiconductor layer over the gate insulating layer, the oxide semiconductor layer overlapping with the gate electrode;
a silicon layer over and in contact with the oxide semiconductor layer, the silicon layer including an intrinsic region, a first impurity region, and a second impurity region, wherein the first impurity region and the second impurity region are provided apart from each other with the intrinsic region interposed between the first impurity region and the second impurity region;
a source electrode layer electrically connected to the first impurity region; and
a drain electrode layer electrically connected to the second impurity region.

7. The transistor according to claim 6,
wherein the oxide semiconductor layer includes at least one of indium, zinc, and gallium.

8. The transistor according to claim 6,
wherein an edge surface of the oxide semiconductor layer is covered with the silicon layer.

9. A semiconductor device comprising the transistor according to claim 6.

* * * * *